US011127653B2

(12) United States Patent
Schlack

(10) Patent No.: US 11,127,653 B2
(45) Date of Patent: Sep. 21, 2021

(54) LATCH ASSEMBLY, HEAT SINK ASSEMBLY, AND COMPUTER PRODUCT INCORPORATING THE SAME

(71) Applicant: Southco, Inc., Concordville, PA (US)

(72) Inventor: Richard E. Schlack, Newark, DE (US)

(73) Assignee: Southco, Inc., Concordville, PA (US)

( * ) Notice: Subject to any disclaimer, the term of this patent is extended or adjusted under 35 U.S.C. 154(b) by 13 days.

(21) Appl. No.: 16/629,670

(22) PCT Filed: Jul. 3, 2018

(86) PCT No.: PCT/US2018/040688
§ 371 (c)(1),
(2) Date: Jan. 9, 2020

(87) PCT Pub. No.: WO2019/014016
PCT Pub. Date: Jan. 17, 2019

(65) Prior Publication Data
US 2021/0151361 A1 May 20, 2021

Related U.S. Application Data

(60) Provisional application No. 62/530,925, filed on Jul. 11, 2017.

(51) Int. Cl.
*H01L 23/40* (2006.01)
*H01L 23/36* (2006.01)
(Continued)

(52) U.S. Cl.
CPC ........ *H01L 23/4093* (2013.01); *G01R 1/0458* (2013.01); *H01L 23/367* (2013.01); *H05K 1/0203* (2013.01); *H05K 2201/066* (2013.01)

(58) Field of Classification Search
CPC ............... H05K 7/2039; H05K 7/2049; H05K 7/20154; H01L 23/367;
(Continued)

(56) References Cited

U.S. PATENT DOCUMENTS 7,342,796 B2  3/2008 Aukzemas
7,344,345 B2  3/2008 Aukzemas
(Continued)

OTHER PUBLICATIONS

International Preliminary Report on Patentability and Written Opinion for International Application No. PCT/US2018/040688, dated Jan. 14, 2020, 6 pages.
(Continued)

*Primary Examiner* — Zachary Pape
*Assistant Examiner* — Amir A Jalali
(74) *Attorney, Agent, or Firm* — RatnerPrestia

(57) ABSTRACT

A latch assembly for latching a heat sink onto a printed circuit board (PCB). The latch assembly includes a clamp having a connector for connecting the latch assembly to the heat sink. A spring is mounted to the clamp for biasing the clamp away from the heat sink. A handle is rotatably connected to the clamp, and a cam extends from the handle. A hook is moveably mounted to the clamp and has a cam surface engaged with the cam. The hook has an engagement portion for engaging the PCB. Rotation of the handle causes (i) rotation of the hook, which causes the engagement portion to engage the PCB, followed by (ii) movement of the cam along the cam surface, which causes translation of the clamp toward the PCB against the bias of the spring, which causes the heat sink to contact an IC for dissipating heat from the IC.

19 Claims, 45 Drawing Sheets

(51) Int. Cl.
*G01R 1/04* (2006.01)
*H05K 1/02* (2006.01)
*H01L 23/367* (2006.01)

(58) Field of Classification Search
CPC ....... H01L 23/40–4006; H01L 23/4093; G06F 1/20; G06F 1/203; G01R 1/0458
See application file for complete search history.

(56) References Cited

U.S. PATENT DOCUMENTS

| | | | |
|---|---|---|---|
| 8,794,889 B2 | 8/2014 | Aukzemas et al. | |
| 2002/0118513 A1* | 8/2002 | Koseki | H01L 23/4093 361/709 |
| 2004/0231826 A1* | 11/2004 | Armstrong | H01L 23/467 165/80.3 |
| 2005/0026491 A1* | 2/2005 | Gattuso | G01R 1/0466 439/342 |
| 2005/0083659 A1* | 4/2005 | Gattuso | H01L 23/4093 361/704 |
| 2005/0099780 A1* | 5/2005 | Hornung | H01L 23/4093 361/719 |
| 2005/0111191 A1* | 5/2005 | Lee | H01L 23/4093 361/704 |
| 2006/0203452 A1* | 9/2006 | Barina | H01L 23/4093 361/704 |
| 2008/0144289 A1* | 6/2008 | Desrosiers | H05K 7/20 361/719 |
| 2017/0117652 A1* | 4/2017 | Hachuda | H01R 13/62922 |

OTHER PUBLICATIONS

International Search Report and Written Opinion for International Application No. PCT/US2018/040688, dated Sep. 27, 2018, 8 pages.

* cited by examiner

LATCH ASSEMBLY, HEAT SINK ASSEMBLY, AND COMPUTER PRODUCT INCORPORATING THE SAME

This application is related to, and claims the benefit of priority of, U.S. Provisional Application No. 62/530,925 filed on 11 Jul. 2017, the contents of which are incorporated herein by reference in their entirety for all purposes.

FIELD OF THE INVENTION

This invention is related to a latch assembly for a heat sink, a heat sink assembly, and a computer product incorporating the same.

BACKGROUND OF THE INVENTION

Modern large scale integrated (LSI) circuits, microprocessors, microchips and other integrated circuit devices (IC chips) generate a substantial amount of heat, especially when operating at high frequencies. Heat sinks are commonly mounted on these IC chips to dissipate as much heat as possible. In such instances the heat sink is mounted to the circuit board, or mounted to a mounting frame, which in turn is mounted to the circuit board on which the IC chip is also mounted.

Spring clips have been used to secure heat sinks, but are sensitive to vibration. Captive fasteners, such as screws or nuts, have also been used to engage respective flanged corners of a heat sink. At higher fastening loads it is not always possible or convenient to utilize traditional fasteners. Improvements in the area of mounting a heat sink onto an IC chip, especially at higher loads, are continually sought.

SUMMARY OF THE INVENTION

According to one aspect of the invention, a latch assembly for latching a heat sink onto a printed circuit board to dissipate heat from an integrated circuit device mounted to the printed circuit board is provided. The latch assembly comprises:
  a clamp having a connector for connecting the latch assembly to the heat sink;
  a spring mounted to the clamp for biasing the clamp away from the heat sink;
  a handle rotatably connected to the clamp;
  a cam extending from the handle;
  a hook moveably mounted to the clamp and having a cam surface engaged with the cam, the hook having an engagement portion for engaging the printed circuit board; and
  wherein rotation of the handle causes (i) rotation of the hook, which causes the engagement portion to engage the printed circuit board, followed by (ii) movement of the cam along the cam surface, which causes translation of the clamp toward the printed circuit board against the bias of the spring, which causes the heat sink to contact the integrated circuit device for dissipating heat from the integrated circuit device.

According to another aspect of the invention, a heat sink assembly for dissipating heat from an integrated circuit device mounted to a printed circuit board is provided. The heat sink assembly comprises:
  a heat sink;
  a clamp movably connected to the heat sink;
  a spring mounted to the clamp for biasing the clamp away from the heat sink;
  a handle rotatably connected to the clamp;
  a cam extending from the handle;
  a hook moveably mounted to the clamp and having a cam surface engaged with the cam, the hook having an engagement portion for engaging the printed circuit board; and
  wherein rotation of the handle causes (i) rotation of the hook, which causes the engagement portion to engage the printed circuit board, followed by (ii) movement of the cam along the cam surface, which causes translation of the clamp toward the printed circuit board against the bias of the spring, which causes the heat sink to contact the integrated circuit device for dissipating heat from the integrated circuit device.

According to yet another aspect of the invention, a computer product comprises:
  a printed circuit board assembly including a printed circuit board and an integrated circuit device and a catch mounted to the printed circuit board;
  a heat sink for dissipating heat from the integrated circuit device;
  a clamp movably connected to the heat sink;
  a spring mounted to the clamp for biasing the clamp away from the heat sink;
  a handle rotatably connected to the clamp;
  a cam extending from the handle;
  a hook moveably mounted to the clamp and having a cam surface engaged with the cam, the hook having an engagement portion for engaging the catch of the printed circuit board; and
  wherein rotation of the handle causes (i) rotation of the hook, which causes the engagement portion to engage the printed circuit board, followed by (ii) movement of the cam along the cam surface, which causes translation of the clamp toward the printed circuit board against the bias of the spring, which causes the heat sink to contact the integrated circuit device for dissipating heat from the integrated circuit device.

According to yet another aspect of the invention, a method for cooling an integrated circuit device on a printed circuit board using a heat sink assembly comprises the steps of:
  engaging a hook of the heat sink assembly with a catch on the printed circuit board; and
  rotating a handle attached to the heat sink assembly to cause the heat sink to be biased toward the printed circuit board and contact the integrated circuit device for transferring heat from the integrated circuit device to the heat sink.

According to still another aspect of the invention, a latch assembly for latching two or more component to one another within a predetermined force range is provided. The latch assembly comprises:
  a clamp having a connector for connecting the latch assembly to one of the components;
  a spring mounted to the clamp for biasing the clamp away from the one of the components;
  a handle rotatably connected to the clamp;
  a cam extending from the handle;
  a hook moveably mounted to the clamp and having a cam surface engaged with the cam, the hook having an engagement portion for engaging another one of the components; and
  wherein rotation of the handle causes (i) rotation of the hook, which causes the engagement portion to engage the another one of the components, followed by (ii) movement of the cam along the cam surface, which causes translation of the one of the components toward the another one of the components against the bias of the spring, which causes the force between the one the other one of the components to be within the predetermined range.

BRIEF DESCRIPTION OF THE DRAWINGS

More particularly, FIG. 7A is a perspective view of the heat sink assembly shown aligned with (yet detached from) the PCB assembly.

FIG. 8A is a perspective view of the heat sink assembly of FIGS. 7A-7C shown initially engaged with the PCB assembly, wherein the hook of the latch assembly is positioned in the catch.

FIG. 9A is a perspective view of the heat sink assembly of FIGS. 7A-7C shown engaged with the PCB assembly, wherein the handle is partially rotated and the hook is engaged into the catch.

FIG. 10A is a perspective view of the heat sink assembly of FIGS. 7A-7C shown engaged with the PCB assembly, wherein the handle is rotated further causing the spring clamp to translate toward the PCB assembly.

FIG. 11A is a side elevation view of the assembly of FIG. 10A of the heat sink assembly of FIGS. 7A-7C shown engaged with the PCB assembly, wherein the handle is rotated further causing the spring clamp to translate toward the PCB assembly.

FIG. 12A is a perspective view of the heat sink assembly of FIGS. 7A-7C shown engaged with the PCB assembly, wherein the handle is rotated to the fastened to position such that the heat sink assembly is fastened to the PCB assembly.

DETAILED DESCRIPTION OF THE INVENTION

Figure 1A:
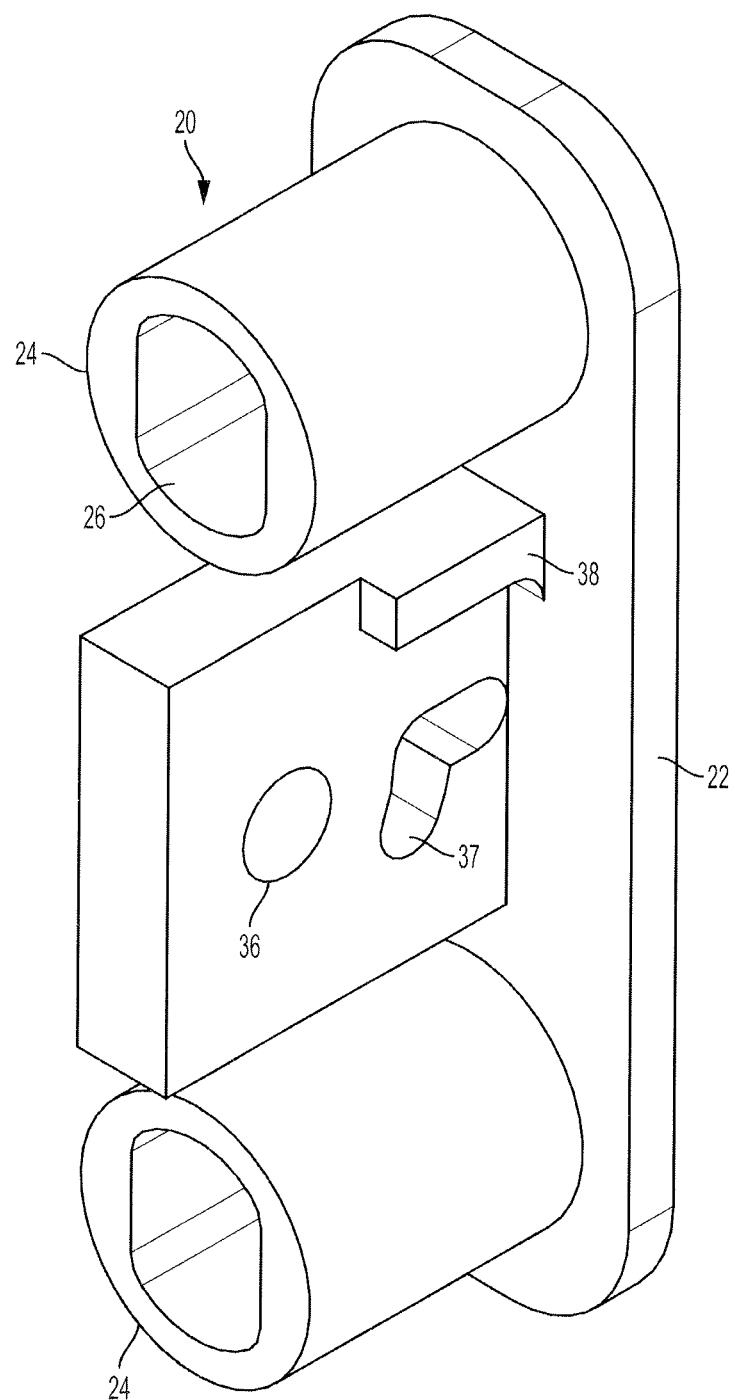
FIGS. 1A-1F are perspective, left, top, front, bottom, and rear side views, respectively, of an embodiment of a spring clamp that can be used in a latch assembly according to one aspect of the invention.
Figure 1B:
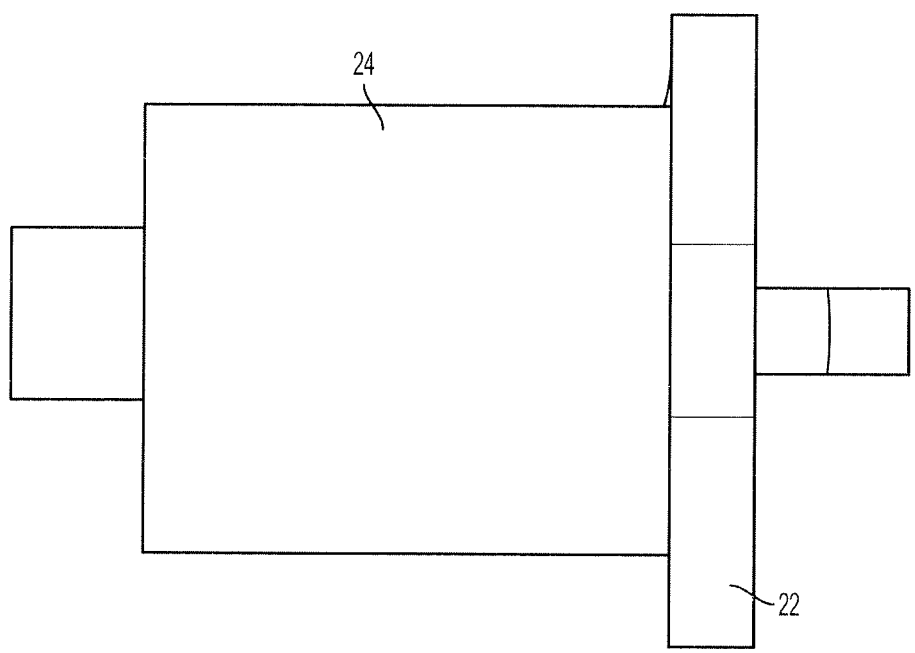
Figure 1C:
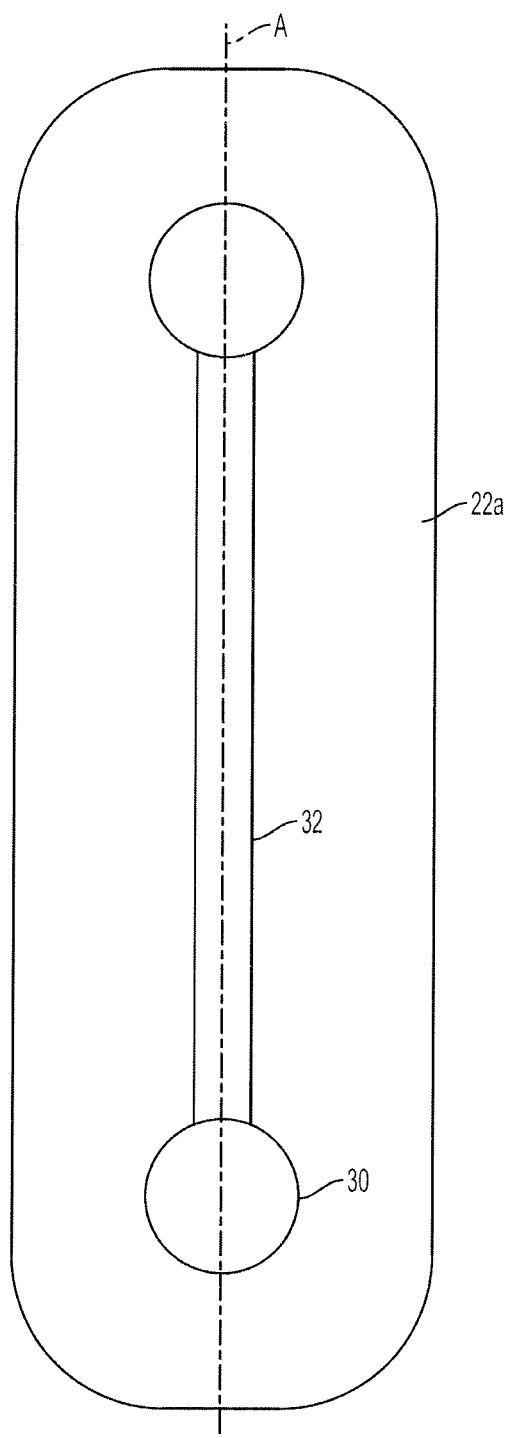
Figure 1D:
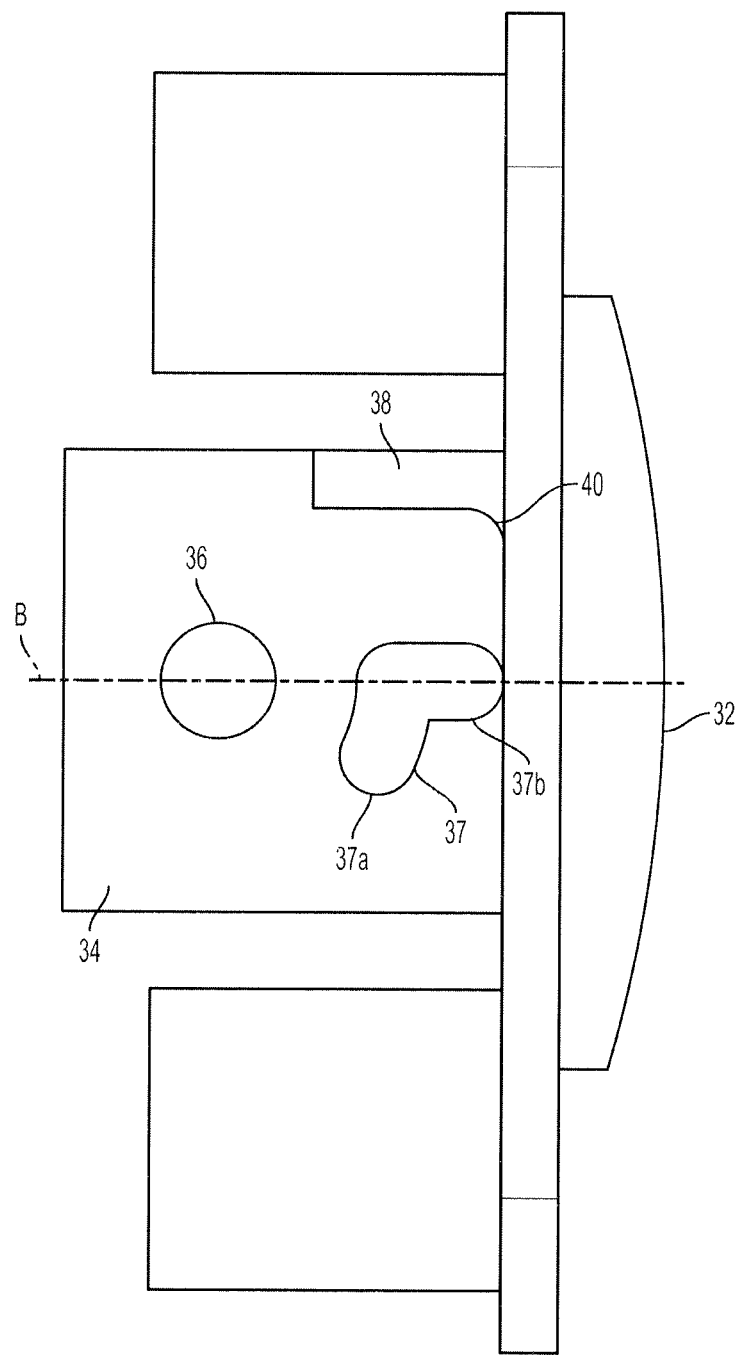
Figure 1E:
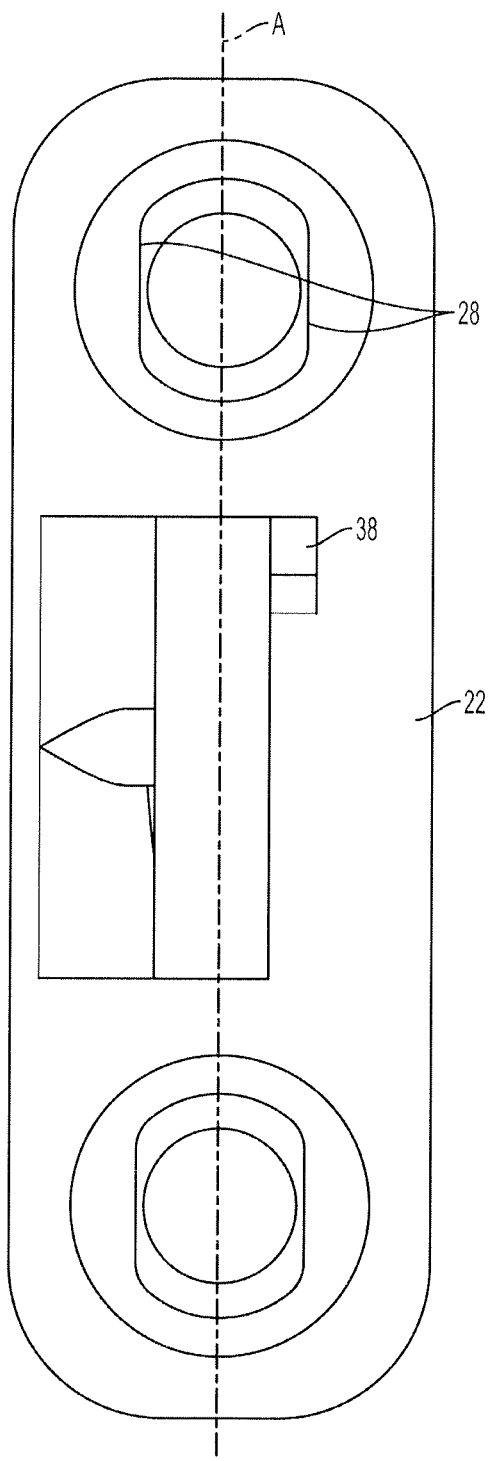
Figure 1F:
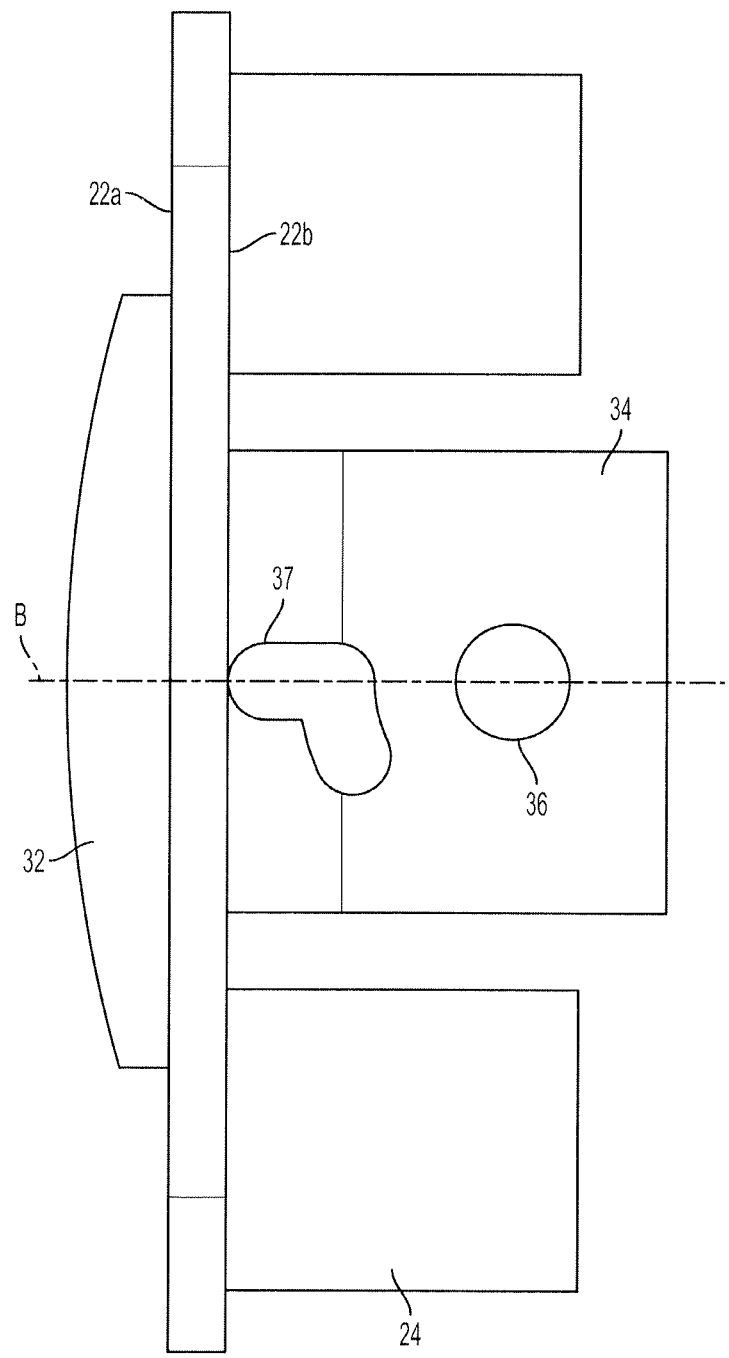
Figure 2A:
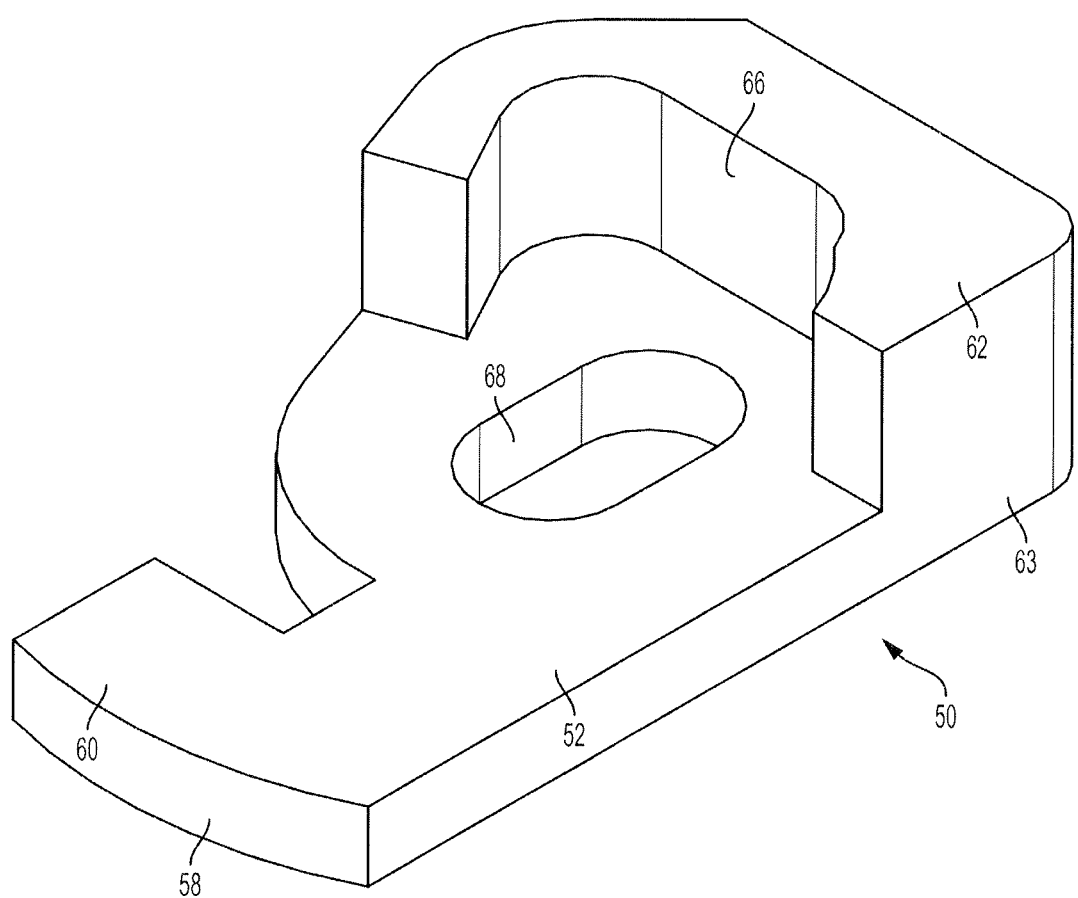
FIGS. 2A-2G are perspective, bottom, right, rear, left, front, and top side views, respectively, of an embodiment of a hook that can be used in a latch assembly according to one aspect of the invention.
Figure 2B:
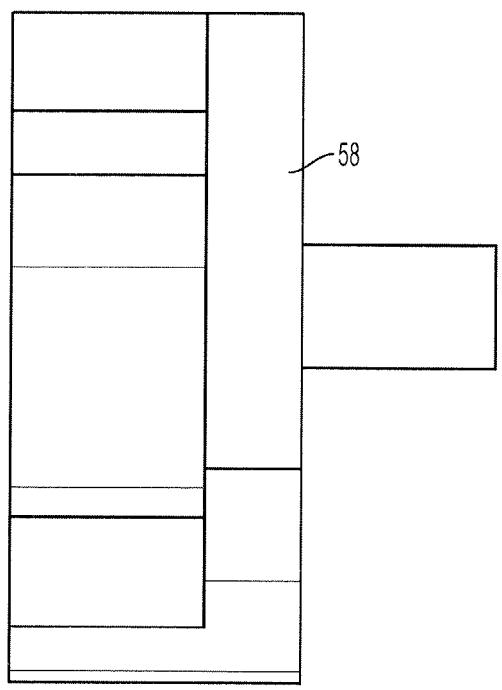
Figure 2C:
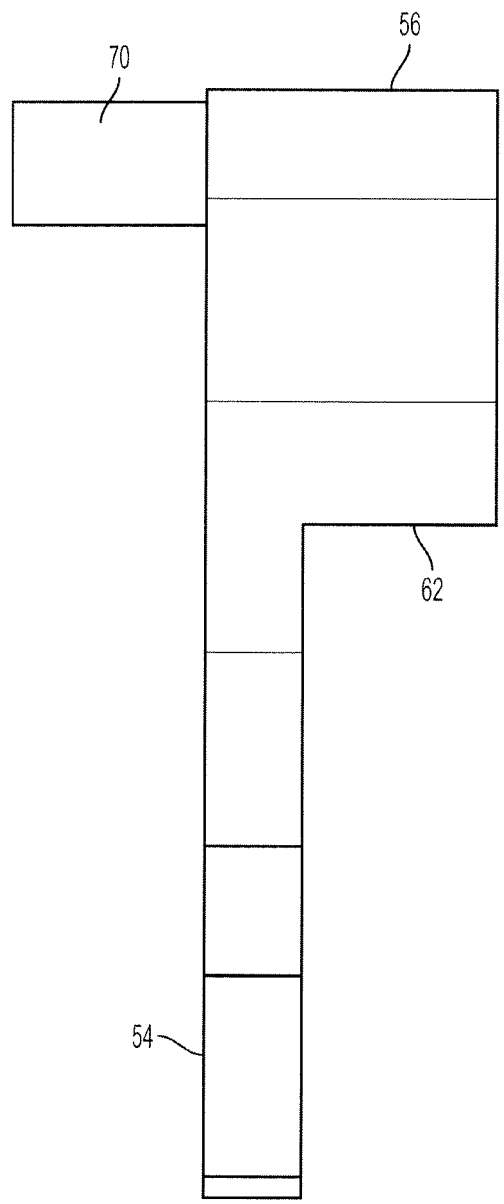
Figure 2D:
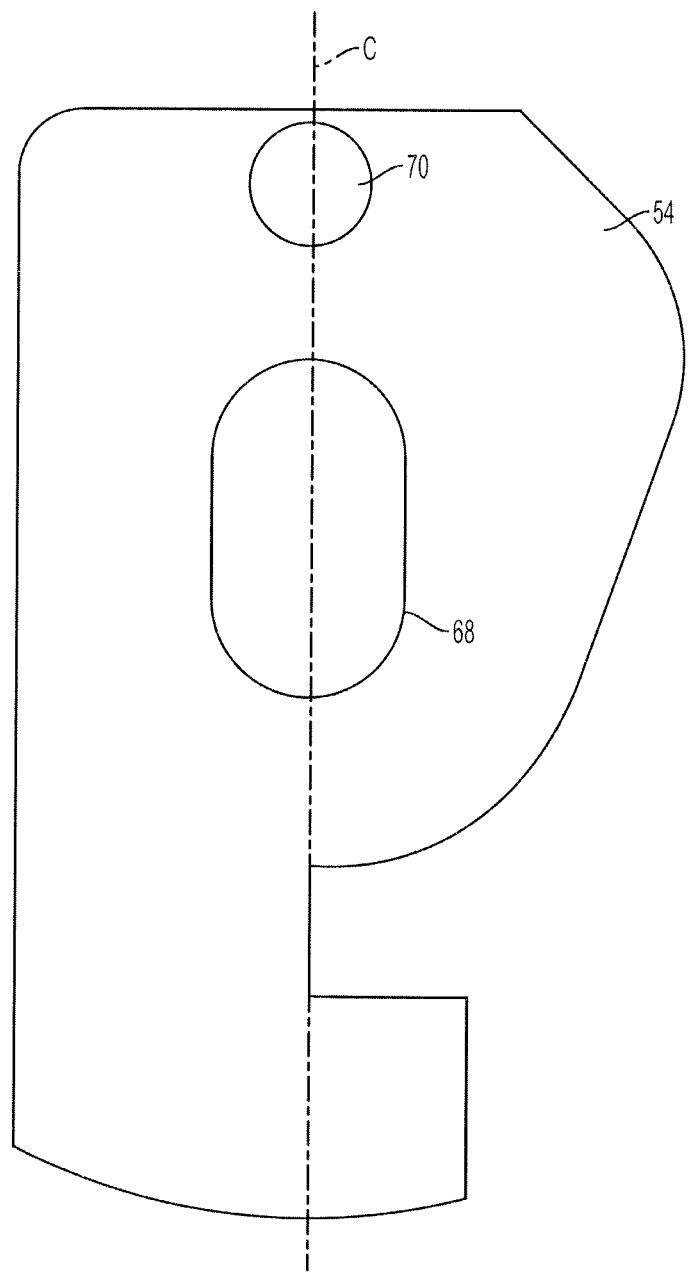
Figure 2E:
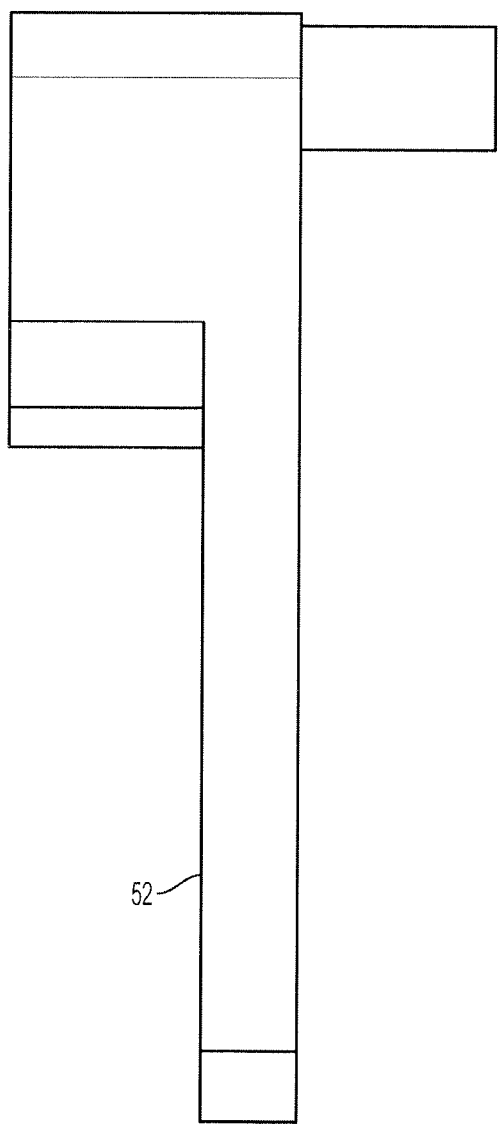
Figure 2F:
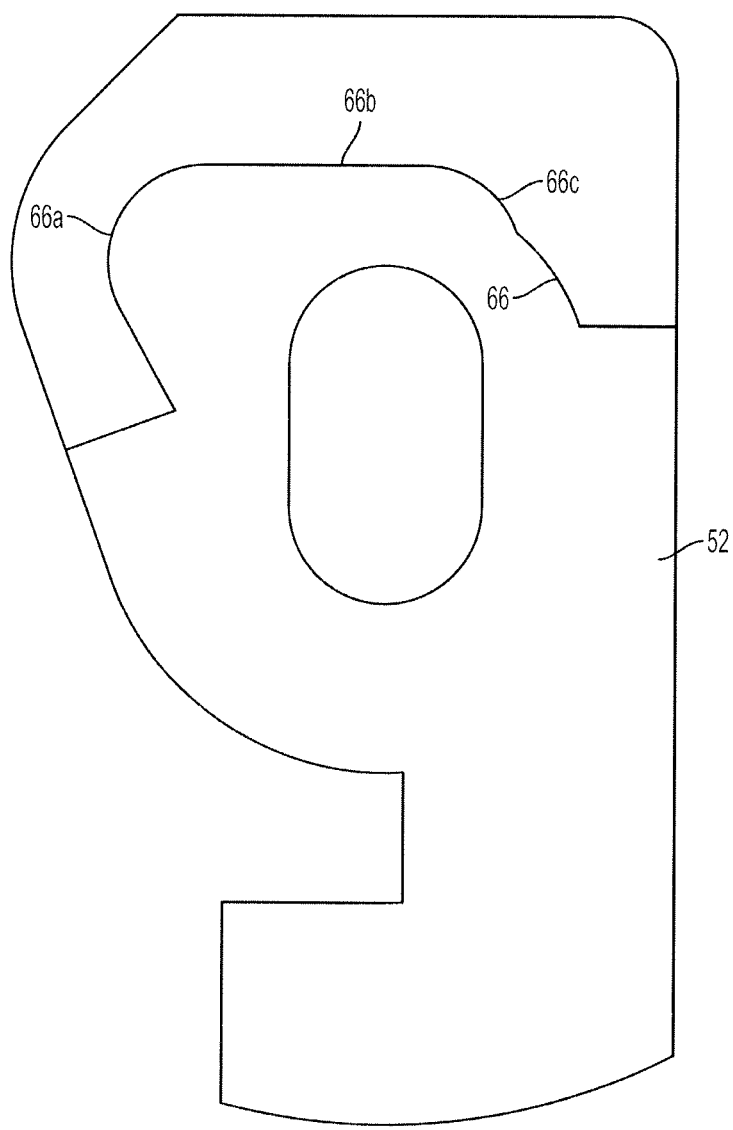
Figure 2G:
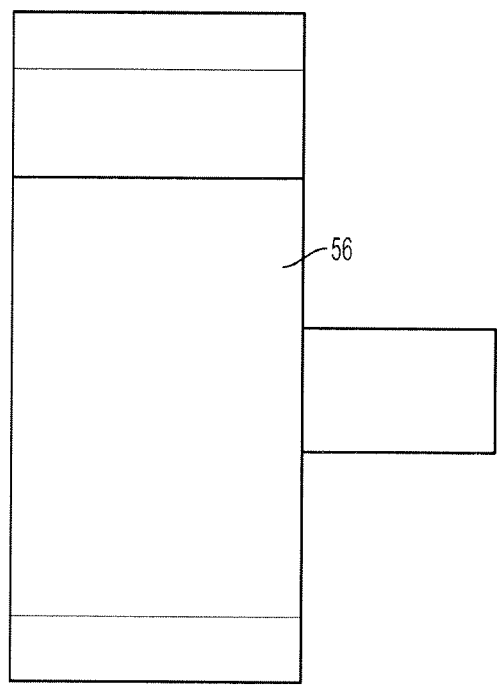
Figure 3A:
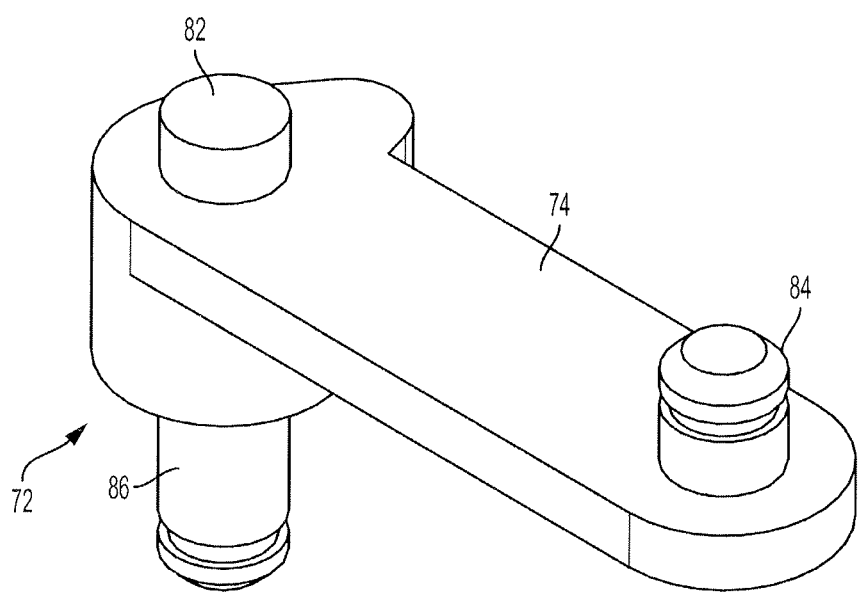
FIGS. 3A-3G are perspective, rear, bottom, left, front, right, and top side views, respectively, of an embodiment of a lever that can be used in a latch assembly according to one aspect of the invention.
Figure 3B:
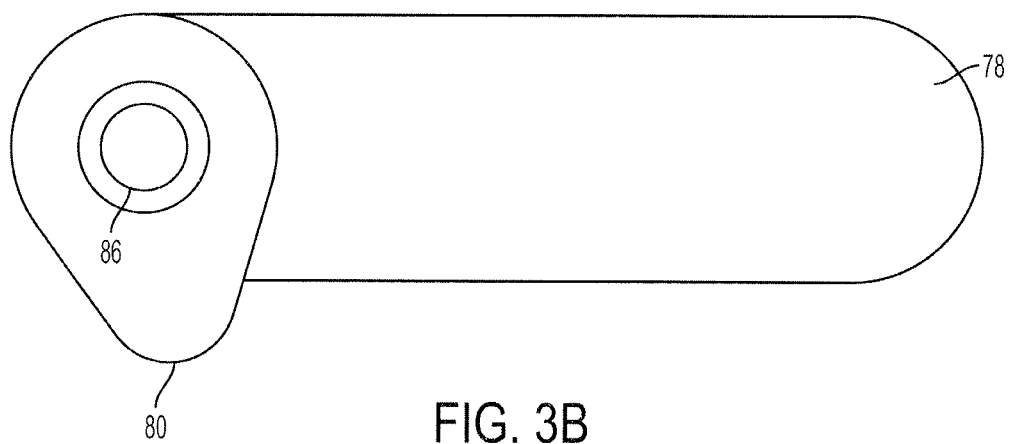
Figure 3C:
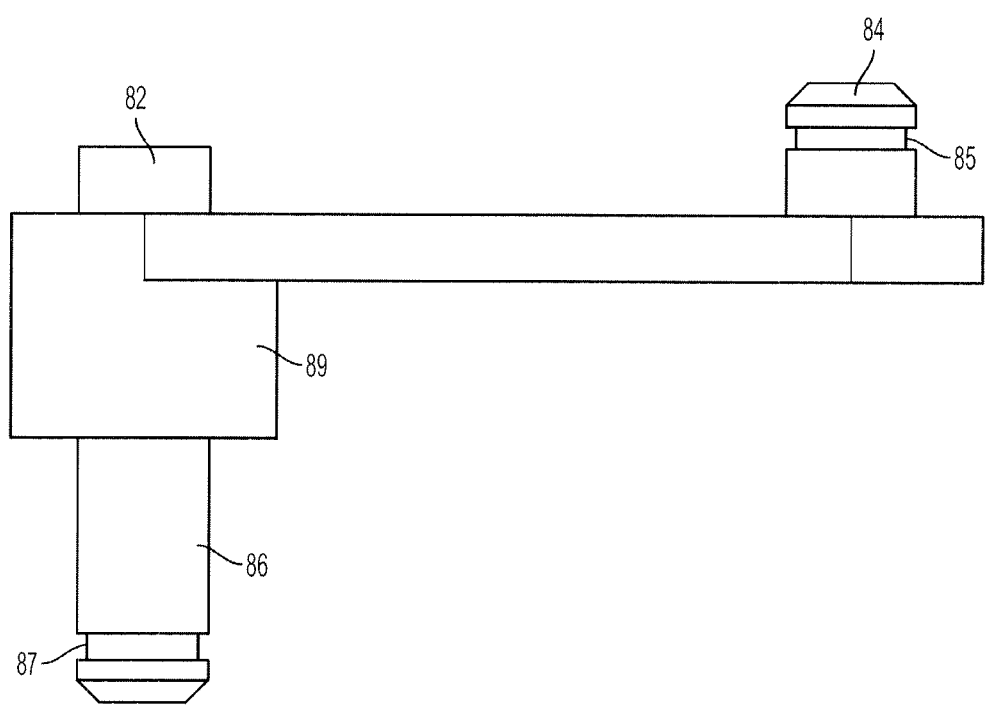
Figure 3D:
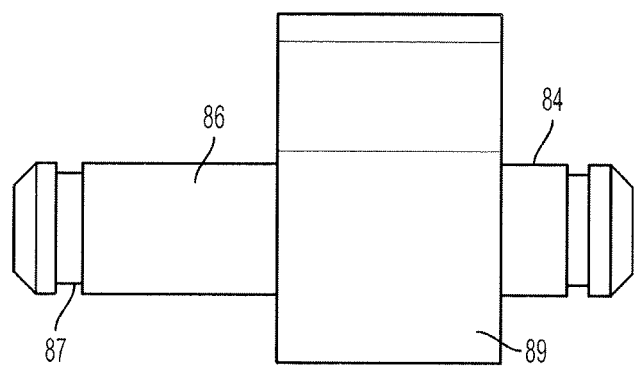
Figure 3E:
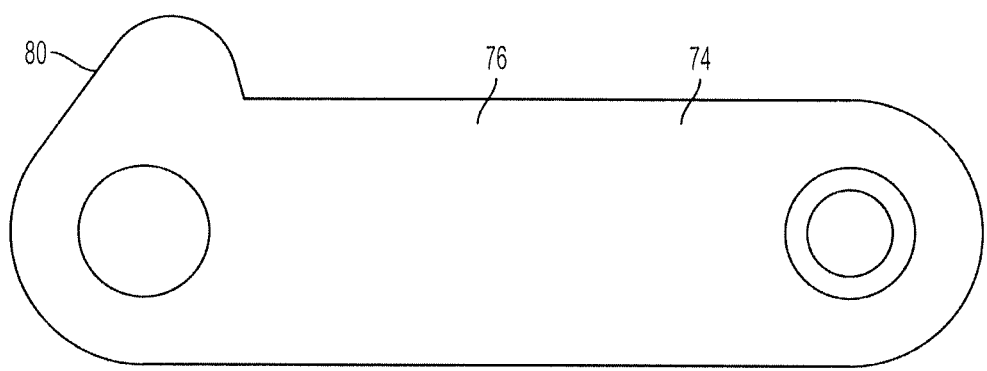
Figure 3F:
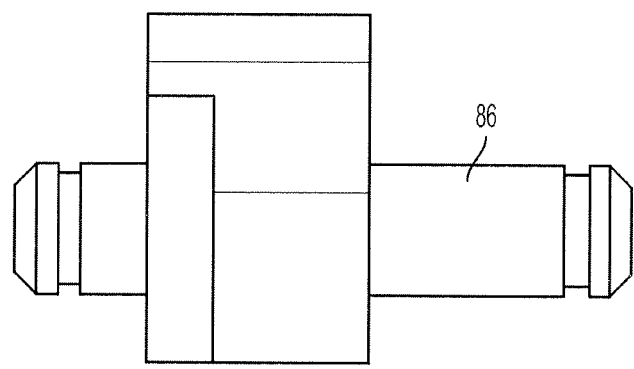
Figure 3G:
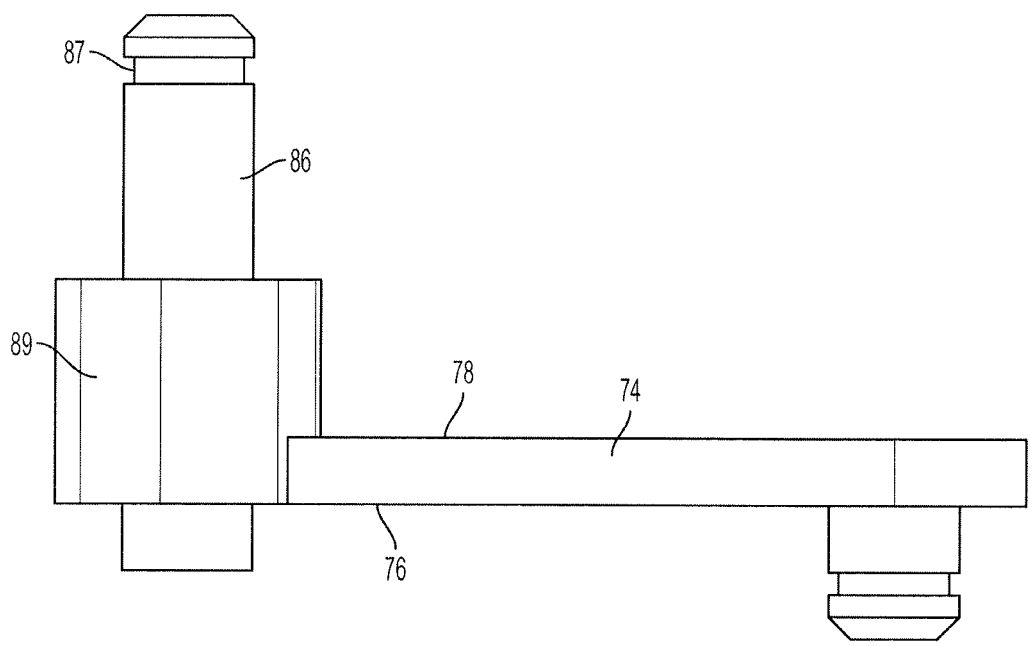

Although the invention is illustrated and described herein with reference to specific embodiments, the invention is not intended to be limited to the details shown. Rather, various modifications may be made in the details within the scope and range of equivalents of the claims and without departing from the invention.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both removable or rigid attachments or relationships, unless expressly described otherwise.

FIGS. 6A-6E depict a latch assembly 12 for latching a heat sink assembly onto a printed circuit board (PCB) assembly. The latch assembly 12 comprises multiple components, which are individually shown in FIGS. 1A-5. The individual components of latch assembly 12 will now be described hereinafter.

FIGS. 1A-1F depict a spring clamp 20 of the latch assembly 12. The spring clamp 20 may also be referred to herein as a clamp. The latch assembly 12 includes two mirror image spring clamps 20. The spring clamp 20 is a unitary body, which may be composed of metal and/or plastic and formed by a molding process, for example.

The spring clamp 20 includes a rectangular shaped flat panel 22 having an upper surface 22a and an lower surface 22b that is opposite the upper surface 22a. Two cylindrical barrels 24 extend downward from opposing ends of the lower surface 22b. Each barrel 24 includes a semi-circular opening 26 having two flat surfaces 28 facing each other. Two openings 30 formed on opposing ends of the panel 22 intersect respective semi-circulars opening 26. Each opening 30 passes through the entire thickness of the panel 22. An arc-shaped projection 32 extends above the upper surface 22a between the two openings 30. The projection 32 is positioned along the major axis A of the spring clamp 20.

A square-shaped tab 34 extends downward and perpendicularly from the lower surface 22b of the panel 22. The tab 34 is positioned along the major axis A between the barrels 24. The tab 34 includes a hole 36 centered on axis B. The hole 36 extends through the thickness of the tab 34. The tab 34 includes a V-shaped slot 37 that is also defined on axis B at an elevation above the hole 36 and at or near where the tab 34 intersects the panel 22. The V-shaped slot 37 includes a first curved track 37a and a second vertical track 37b that are interconnected with each other. The V-shaped slot 37 extends through the thickness of the tab 34. A wall 38 is positioned at the top left-hand end of the front face of the tab 34. The top surface 40 of the wall 38, which extends toward the axis B is curved.

FIGS. 2A-2G depict a hook 50 of the latch assembly 12. The latch assembly 12 includes two hooks 50. The hooks 50 are a mirror image of each other. Each hook 50 is a unitary body, which may be composed of metal and/or plastic and formed by a molding process, for example.

The hook 50 is a thin-walled and "g"-shaped body having a front face 52, a rear face 54, a top face 56, a bottom face 58 and a side face 63. An engagement portion 60 in the shape of a hook is defined at the bottom end of the hook 50. The shape of the engagement portion 60 may vary. The bottom end of the engagement portion 60 comprises the bottom face 58. A curved protrusion 62 extends perpendicularly from the top end of the front face 52 of the hook 50. The top end of the curved protrusion 62 comprises the top face 56 of the hook 50.

A curved surface 66 of the protrusion 62 is opposite the top face 56. The curved surface 66 comprises curved section 66a, straight section 66b and curved section 66c. The curved surface 66 may be considered as a cam surface, and may be referred to herein as cam surface 66.

A slot 68 is defined on the major axis C of the hook 50, and is defined in the approximate center of the hook 50. A cylindrical post 70 extends from the top end of the rear face 54 of the hook 50. The post 70 is also defined on the major axis C of the hook 50 at an elevation above the slot 68.

FIGS. 3A-3G depict a lever 72 of the latch assembly 12. The latch assembly 12 includes two levers 72. The levers 72 are a mirror image of each other. Each lever 72 is a unitary body, which may be composed of metal and/or plastic and formed by a molding process, for example. Although not shown, the levers 72 could be integrated with the handle 90.

The lever 72 includes an elongated panel 74 having rounded ends and including a front face 76 and a rear face 78. A cam 80 in the form of a rounded surface is defined at the left top corner of the panel 74. Two cylindrical posts 82 and 84 extend from opposing ends of the front face 76 of the panel 74. The post 84 includes a channel 85 defined about its circumference. The post 86 extends from a cylinder 89 that is positioned on the left side and rear face 78 of the panel 74. The longitudinal axis of the post 86 is coincident with the longitudinal axis of the post 82. The post 86 also includes a channel 87 defined about its circumference.

Figure 4A:
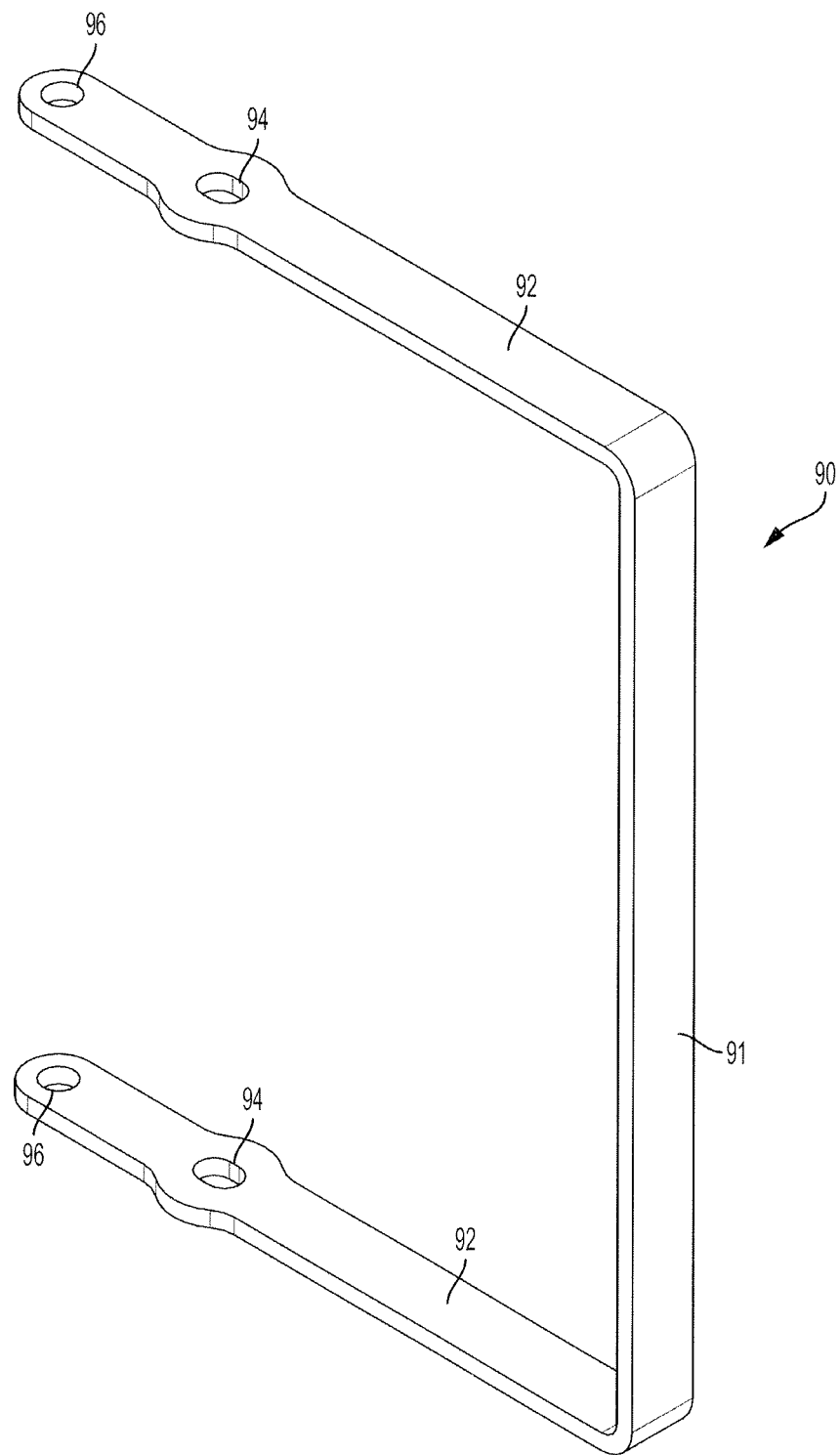
FIGS. 4A and 4B are perspective and side elevation views, respectively, of an embodiment of a handle that can be used in a latch assembly according to one aspect of the invention.
Figure 4B:
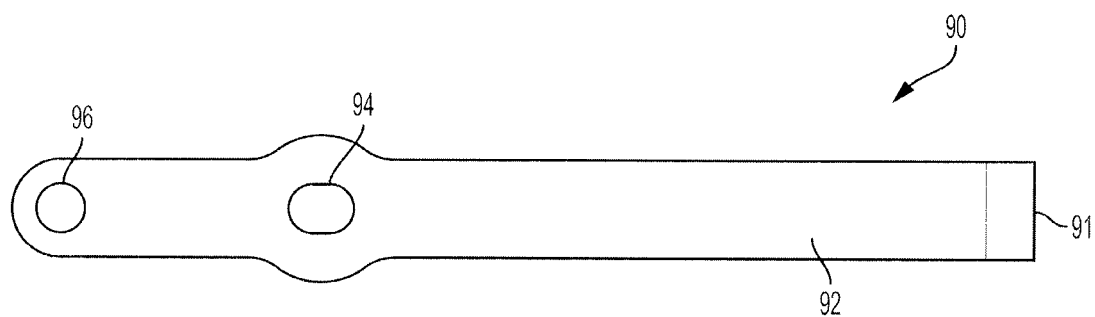

FIGS. 4A and 4B depict a handle 90 of the latch assembly 12. The handle 90 is configured to be grasped and rotated by a user. The handle 90 is a unitary body, which may be composed of metal and/or plastic and may be formed by a bending process or a molding process, for example. The handle 90 is a U-shaped body comprising a horizontal arm 91 and two legs 92 depending from the horizontal arm 91. An elongated hole or slot 94 is formed on each leg 92. A hole 96 is defined at the free end of each leg 92. The holes 92 and the slots 94 extend through the material thickness of the legs 92.

Figure 5:
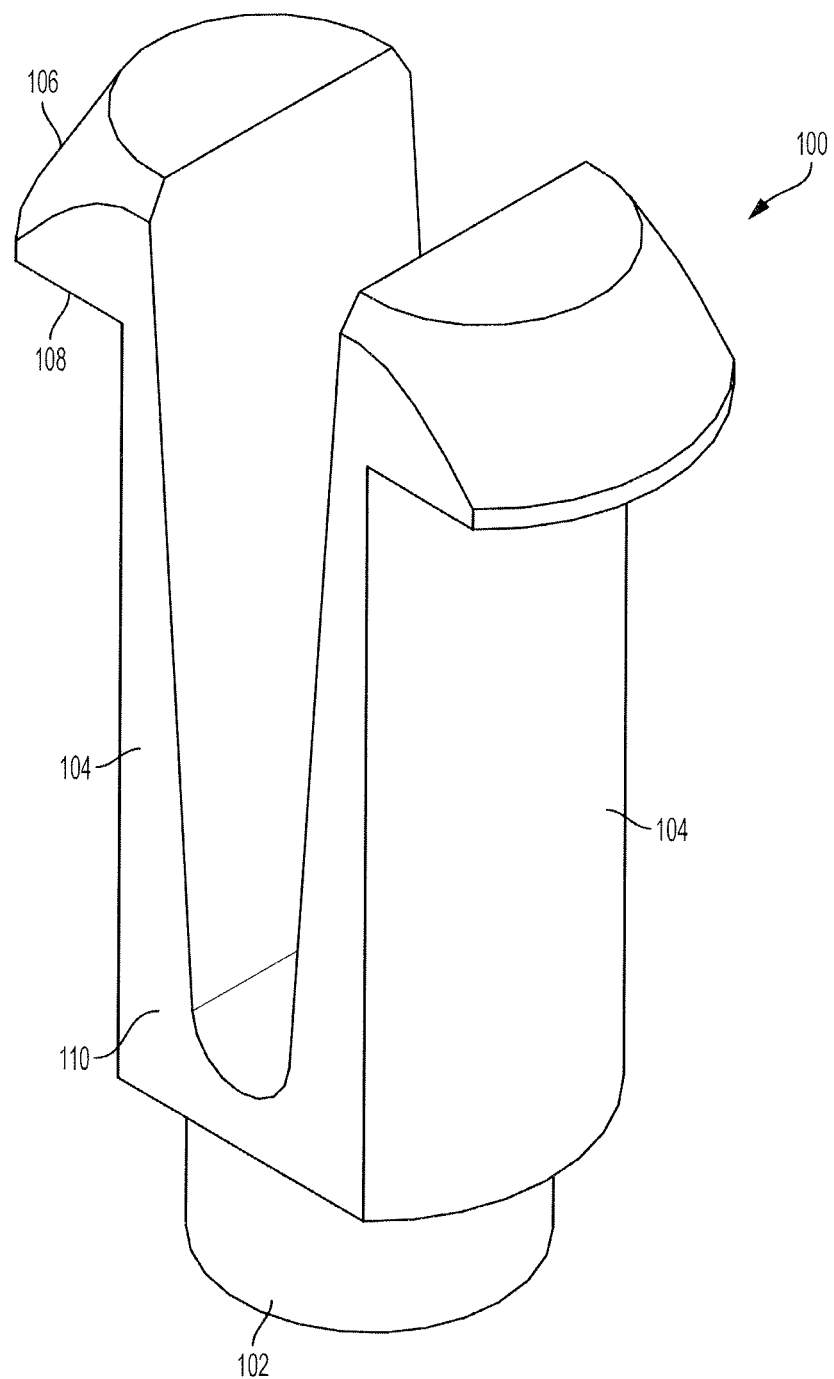
FIG. 5 is a perspective view of an embodiment of a retainer that can be used in a latch assembly according to one aspect of the invention.
Figure 6A:
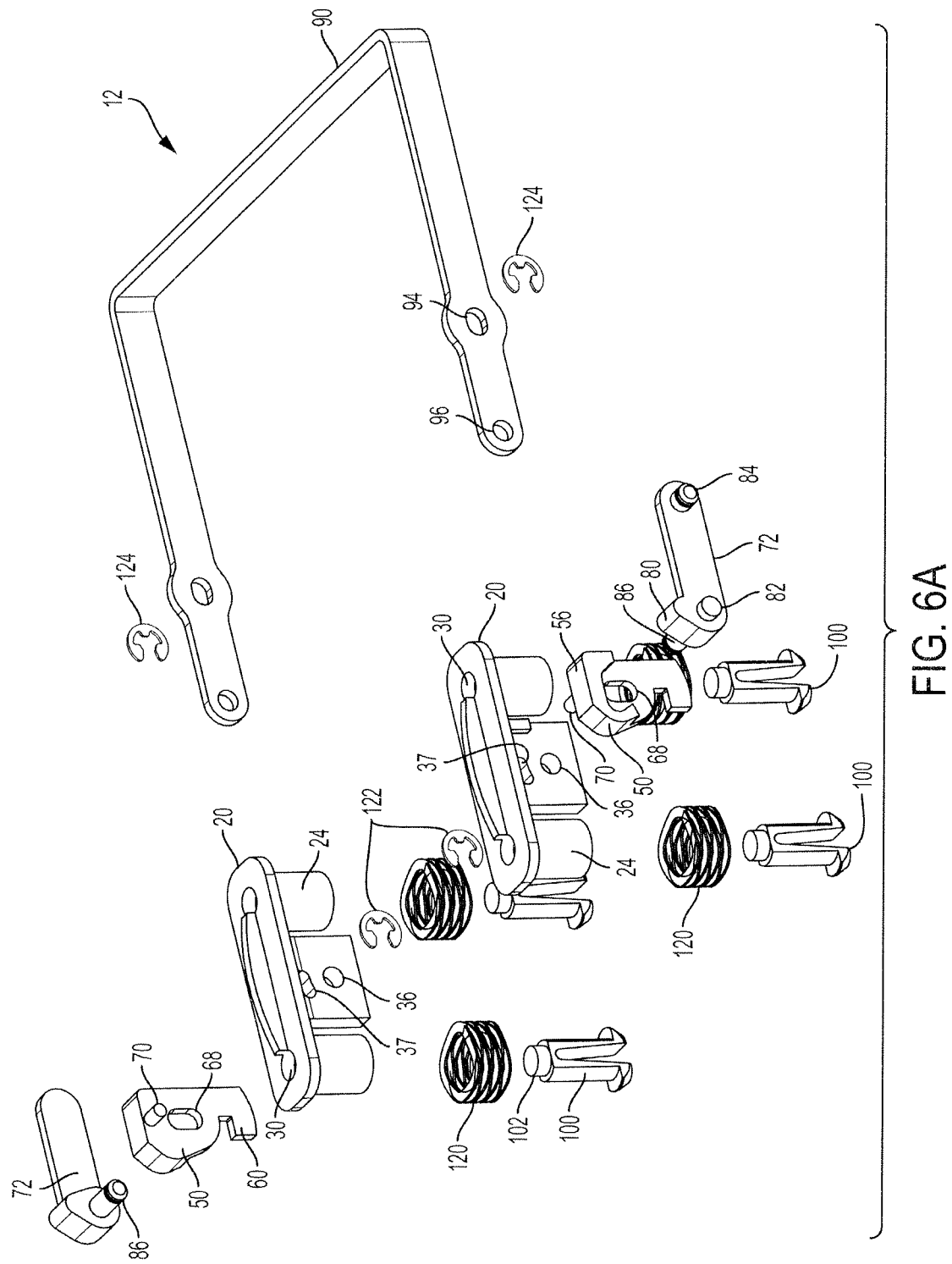
FIG. 6A is an exploded view of a latch assembly according to one aspect of the invention.
Figure 6B:
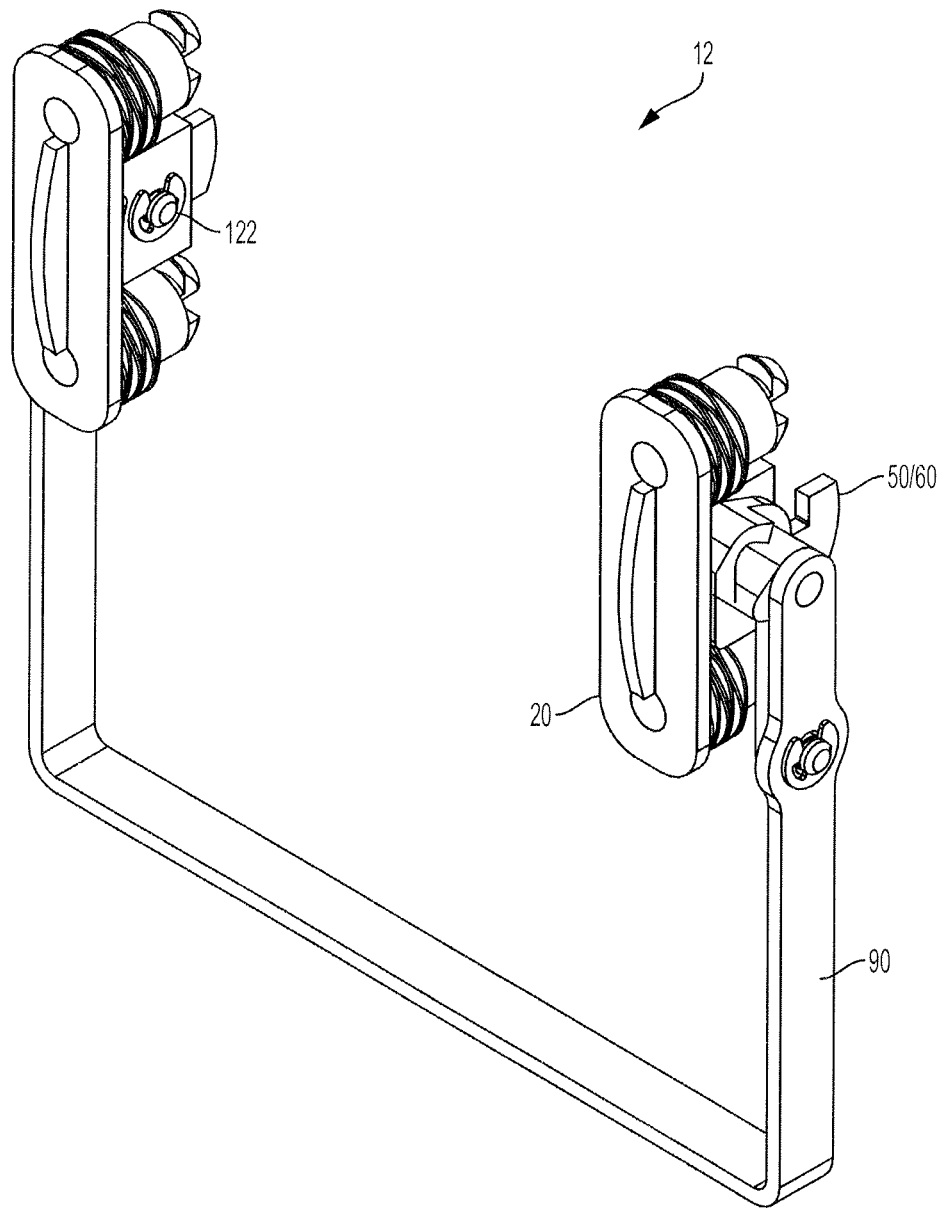
FIGS. 6B-6E are perspective, top, front and left side views of the latch assembly of FIG. 6A shown assembled.
Figure 6C:
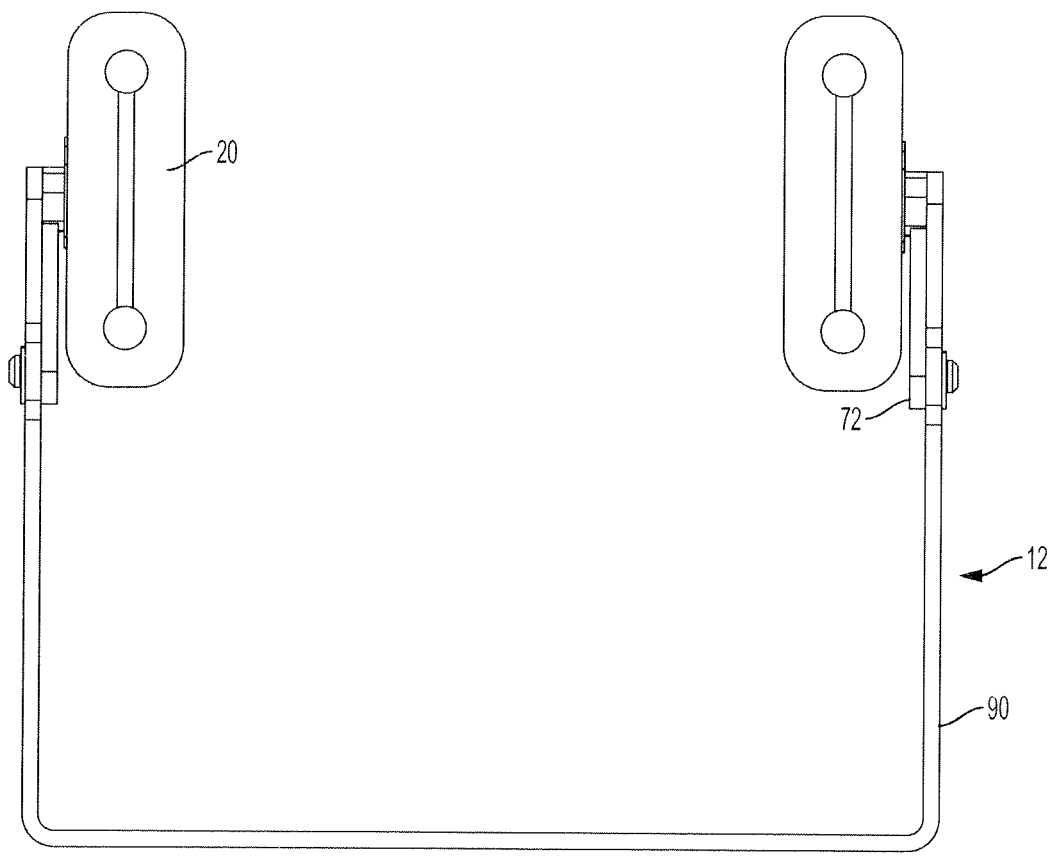
Figure 6D:
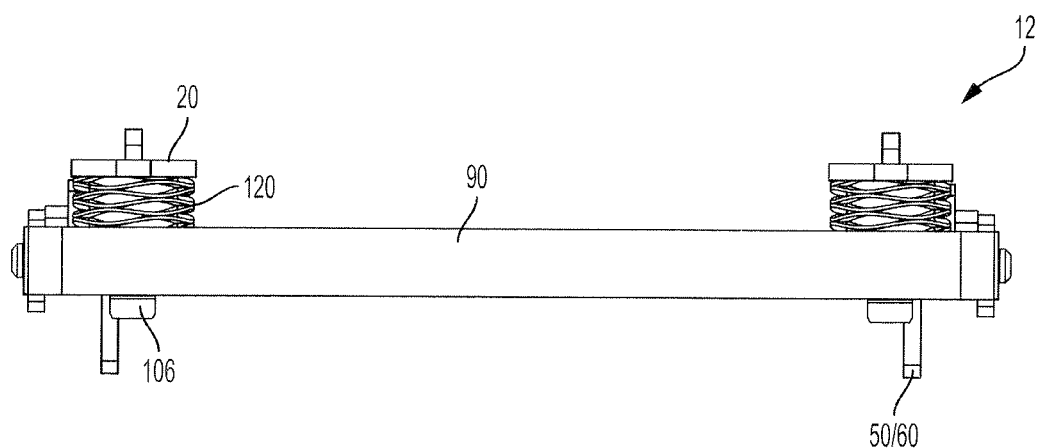
Figure 6E:
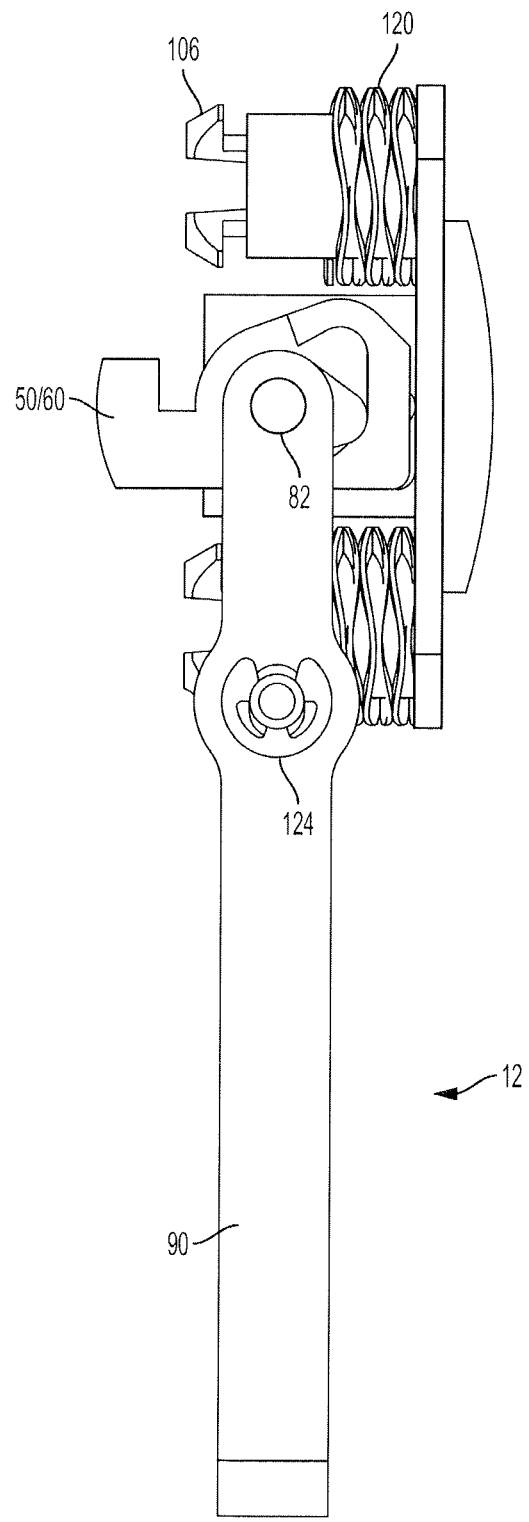

FIG. 5 depicts a retainer 100 of the latch assembly 12. The retainer 100 may also be referred to herein as a connector for connecting the spring clamp 20 to a heat sink. The latch assembly 12 includes four identical retainers 100. The retainer 100 is a unitary body, which may be composed of metal or plastic and formed by a molding process, for example. The retainer 100 comprises a body having a cylindrical top end 102 and flexible prongs 104 bifurcating from the end 102. A barb 106 having a planar underside surface 108 is formed at the free end of each prong 104. The front and rear sides 110 of the retainer 100 are planar whereas the remainder of the body of the retainer 100 is substantially cylindrical so as to complement the geometry of the semi-circular opening 26 of the spring clamp 20 into which the retainer 100 is inserted.

It should the understood that the latch assembly 12 is not limited to the retainers 100. Others means for connecting the spring clamp 20 to the heat sink are envisioned, such as a fastener, clip, clamp, pin, or rod.

Referring now to FIGS. 6A-6E, to assemble the latch assembly 12, a wave spring 120 (four total) is inserted over the outside of each barrel 24 of the spring clamps 20. Two retainers 100 are then mounted to each of the two spring clamps 20 by inserting the top end 102 of each retainer 100 through the opening 26 of the spring clamp 20 until the cylindrical base 102 of each retainer 100 is fixed in a respective opening 30 of the spring clamp 20. The barbs 106 protrude from the bottom end of the barrels 24. The cylindrical base 102 may be fixed in the opening 30 by a weld, adhesive, or interference fit, for example. The retainers 100 retain the wave springs 120 onto the spring clamps 20, which is useful during handling of the latch assembly 12 prior to attaching the latch assembly 12 onto the heat sink 130.

The hooks 50 are then installed onto respective spring clamps 20. More particularly, the post 70 of each hook 50 is inserted through the V-shaped slot 37 at the front side of each spring clamp 20. The top face 56 of the hook 50 is oriented to face the bottom side 22b of the spring clamp 20.

Thereafter, the levers 72 are installed onto the hooks 50 by inserting the post 86 of each lever 72 through the slot 68 of the hook 50 and then through the hole 36 of the spring clamp 20. A ring clip 122 is positioned in the channel 87 (see FIG. 3C) of the post 86 to captivate the lever 72, the spring clamp 20 and the hook 50 together. The posts 84 and 82 of each lever 72 are then inserted through the holes 94 and 96, respectively, of the handle 90, and a ring clip 124 is mounted in the channel 85 (see FIG. 3C) to captivate the handle 90 to the lever 72 such that the handle 90 and the levers 72 move together. The latch assembly 12 is now assembled.

It should be understood that the above-described method for assembling the latch assembly 12 is not limited to any particular step or sequence of steps.

Figure 7A:
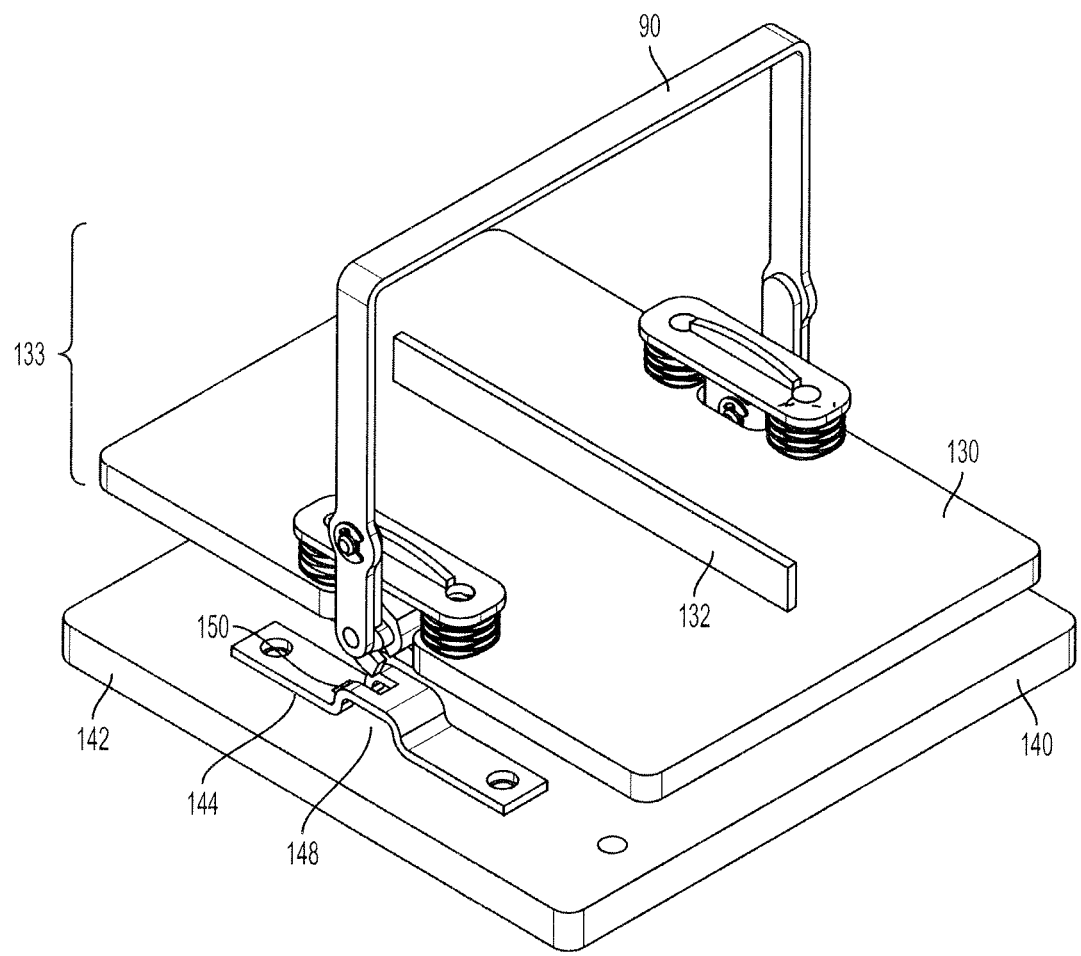
FIGS. 7A, 8A, 9A, 10A, 11A and 12A depict the sequence of latching a heat sink assembly comprising a heat sink and the latch assembly of FIGS. 6B-6E, onto a printed circuit board (PCB) assembly comprising a PCB, an integrated circuit chip and a catch for receiving the hook of the latch assembly.
Figure 7B:
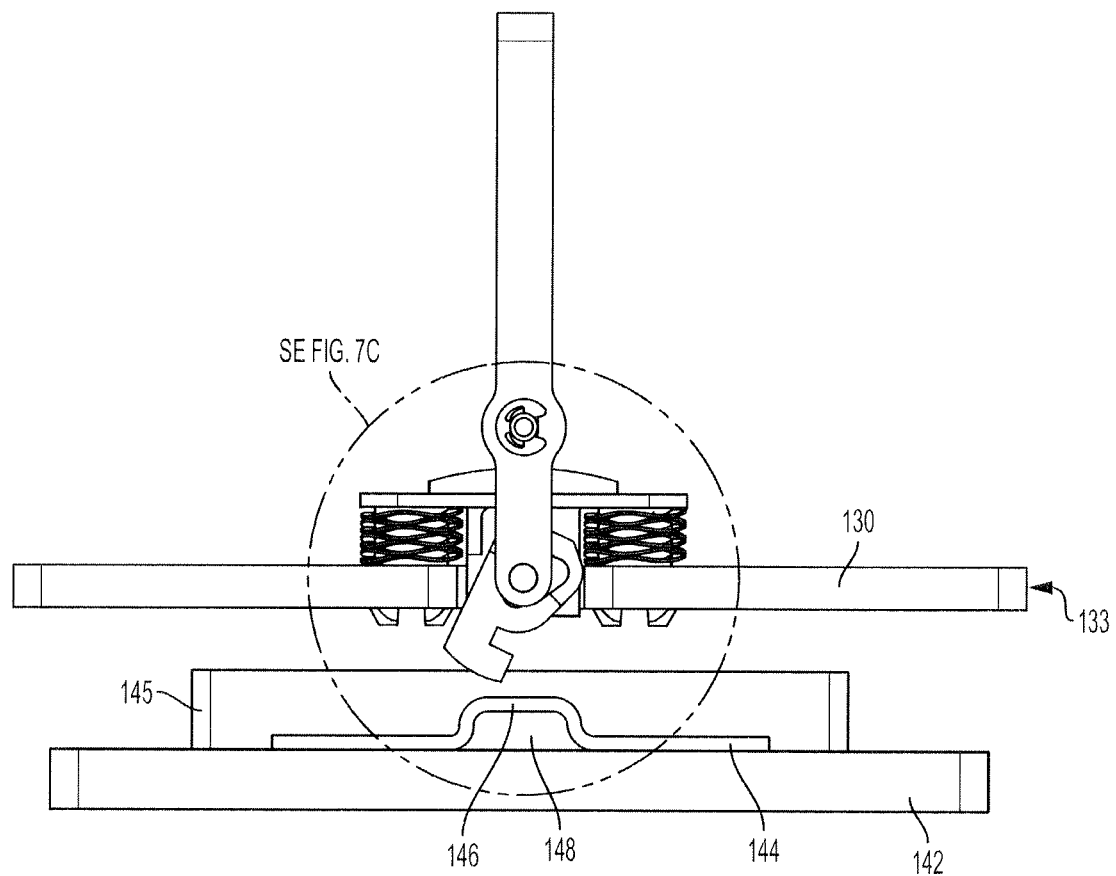
FIG. 7B is a side elevation view of the detached assembly of FIG. 7A.
Figure 7C:
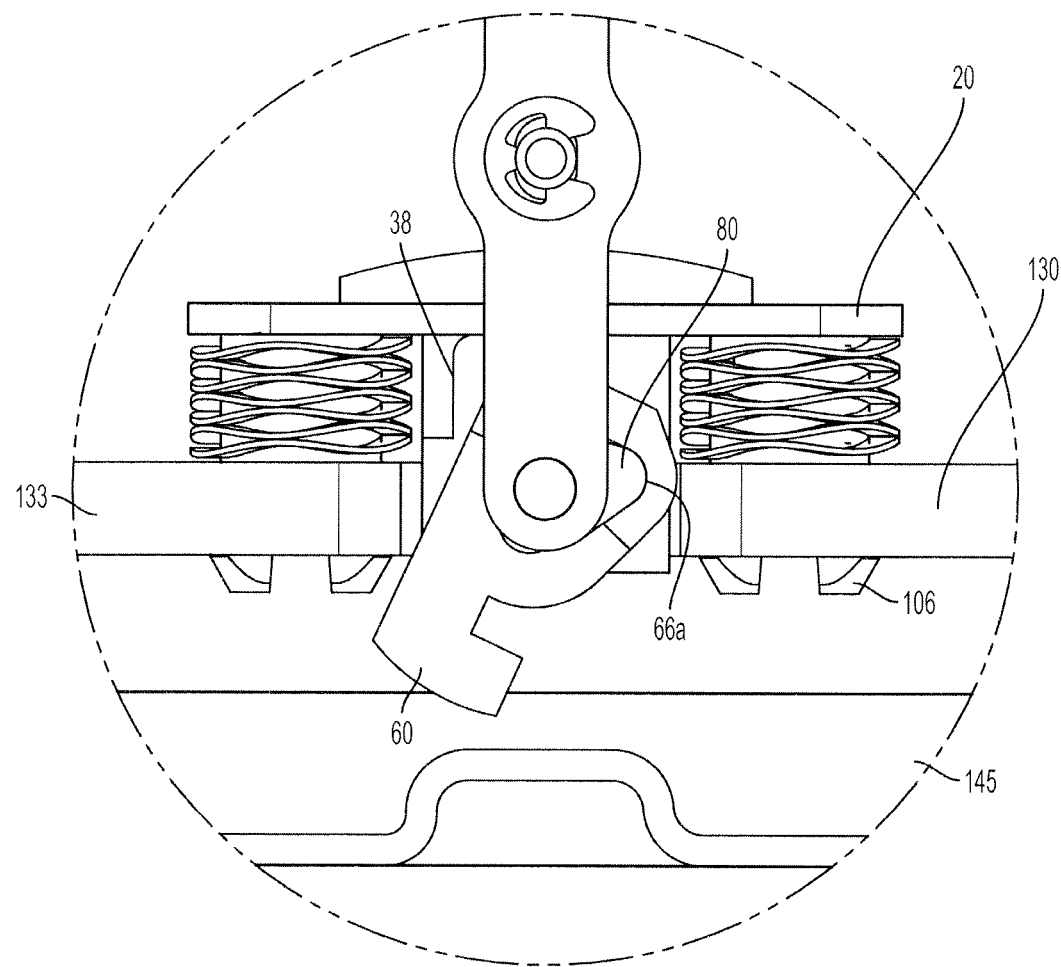
FIG. 7C is a detailed view of the detached assembly of FIG. 7B.

Referring now to FIGS. 7A-7C, the latch assembly 12 is then assembled onto a heat sink 130 to form a heat sink assembly 133. The heat sink 130 is formed of a conductive material, such as aluminum, and comprises a top surface having fins 132 (one fin shown in FIG. 7A only), a flat lower surface for contacting a heat producing integrated circuit chip 146, and a series of holes extending through the top and bottom surfaces for receiving the retainers 100 and spring clamps 20.

It is noted that the fins 132 could extend in any direction on the base of the heat sink 130, and are not limited to that which is shown. It is also noted that the latch assembly 12 utilizes about the same surface area of the heat sink 130 as would traditional heat sink fasteners, thus, the latch assembly 12 does not detrimentally impact the heat transfer area provided by the heat sink 130 as compared with traditional heat sink fasteners.

The latch assembly 12 is assembled to the heat sink 130 by inserting the barbs 106 of the retainers 100 through corresponding holes in the heat sink 130. Thereafter, the entire latch assembly 12 is captivated to the heat sink 130. The assembly of the latch assembly 12 and the heat sink 130 forms a heat sink assembly 133 that is releasably mountable to a printed circuit board (PCB) assembly 140.

The PCB assembly 140 generally comprises a PCB 142, two catches 144 fixedly mounted to the top side of the PCB 142, and the heat producing integrated circuit chip 145 (chip 145 hereinafter) fixedly mounted to the top side of the PCB 142 and located between the catches 144. The chip 145 may be a ball grid array style IC that is seated on a ball grid array of contacts provided on a socket mounted to the PCB 142. The heat sink assembly 133 urges the chip 145 against the ball grid array socket.

Each catch 144 is configured to receive one of the engagement portions 60 of a hook 50. Although not shown, a thermally conductive material, such as an elastomeric sheet or grease, may be positioned on top of the chip 145 and/or the flat lower surface of the heat sink 130.

Each catch 144 of the PCB assembly 140 may be a rectangular sheet metal component, for example, having a raised center section 146. A rectangular slot 150 is formed on one side of the raised center section 146 for receiving the engagement portion 60 of a hook 50. The raised center section 146 defines a gap 148 between the underside of section 146 and the top side of the PCB 142 for accommodating the engagement portion 60.

FIGS. 7A, 8A, 9A, 10A, 11A and 12A depict the sequence of latching a heat sink assembly 133 onto the PCB assembly 140 to form a computer product. Although only one side of the latching operation is shown and described, it should be understood that the other side is substantially identical.

Starting from FIGS. 7A-7C, those figures depict the heat sink assembly 133 shown aligned with (yet detached from) the PCB assembly 140. At this stage, the engagement portions 60 are merely aligned with respective slots 150 of the catches 144.

Figure 8A:
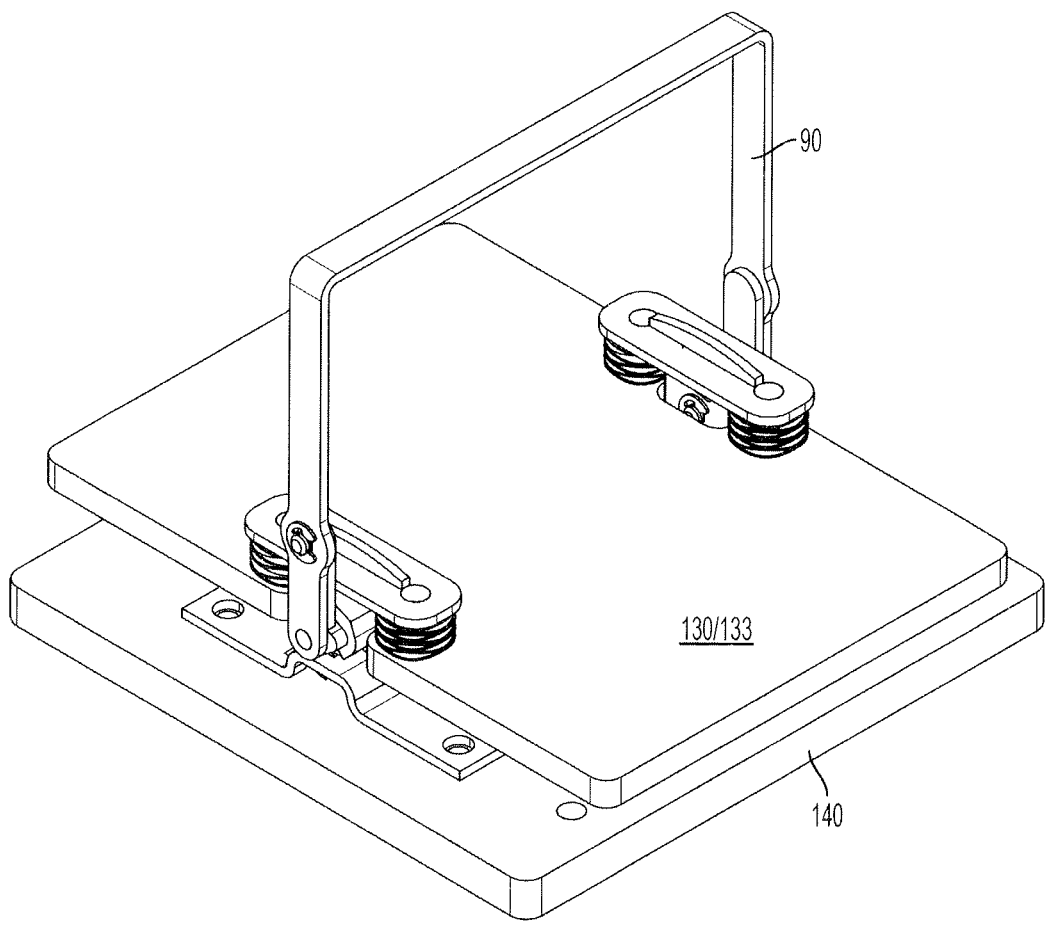
Figure 8B:
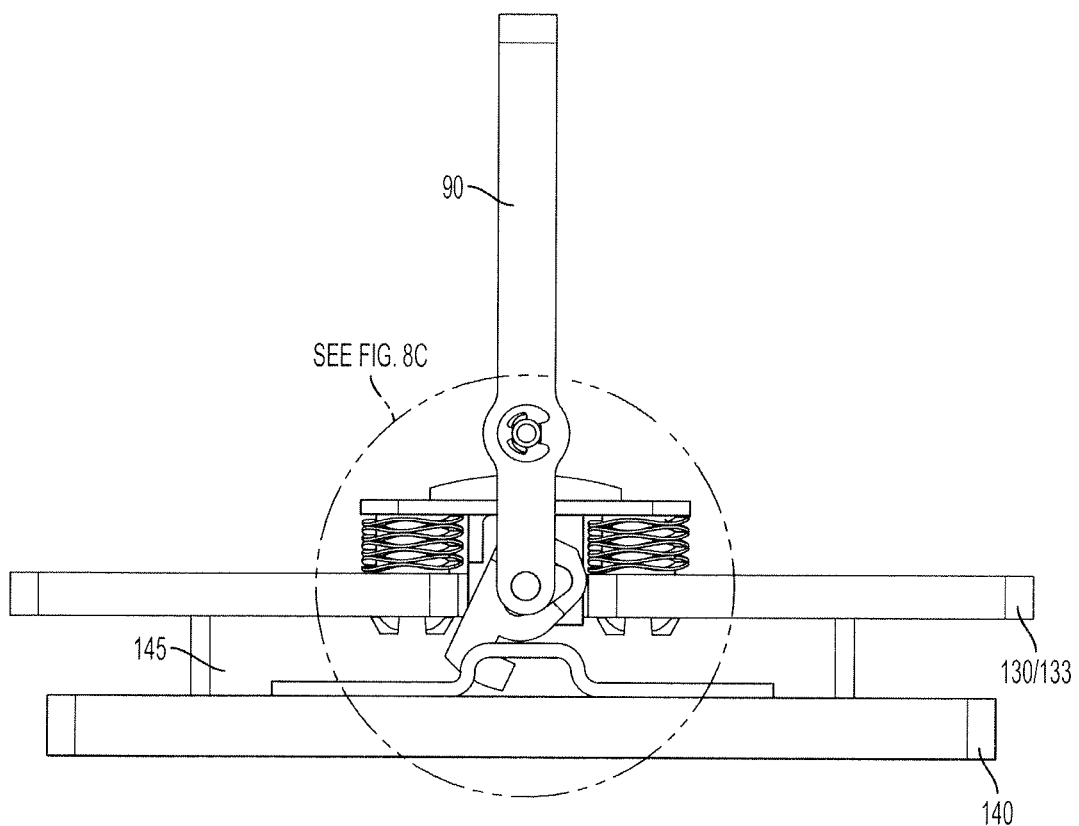
FIG. 8B is a side elevation view of the initially engaged assembly of FIG. 8A.
Figure 8C:
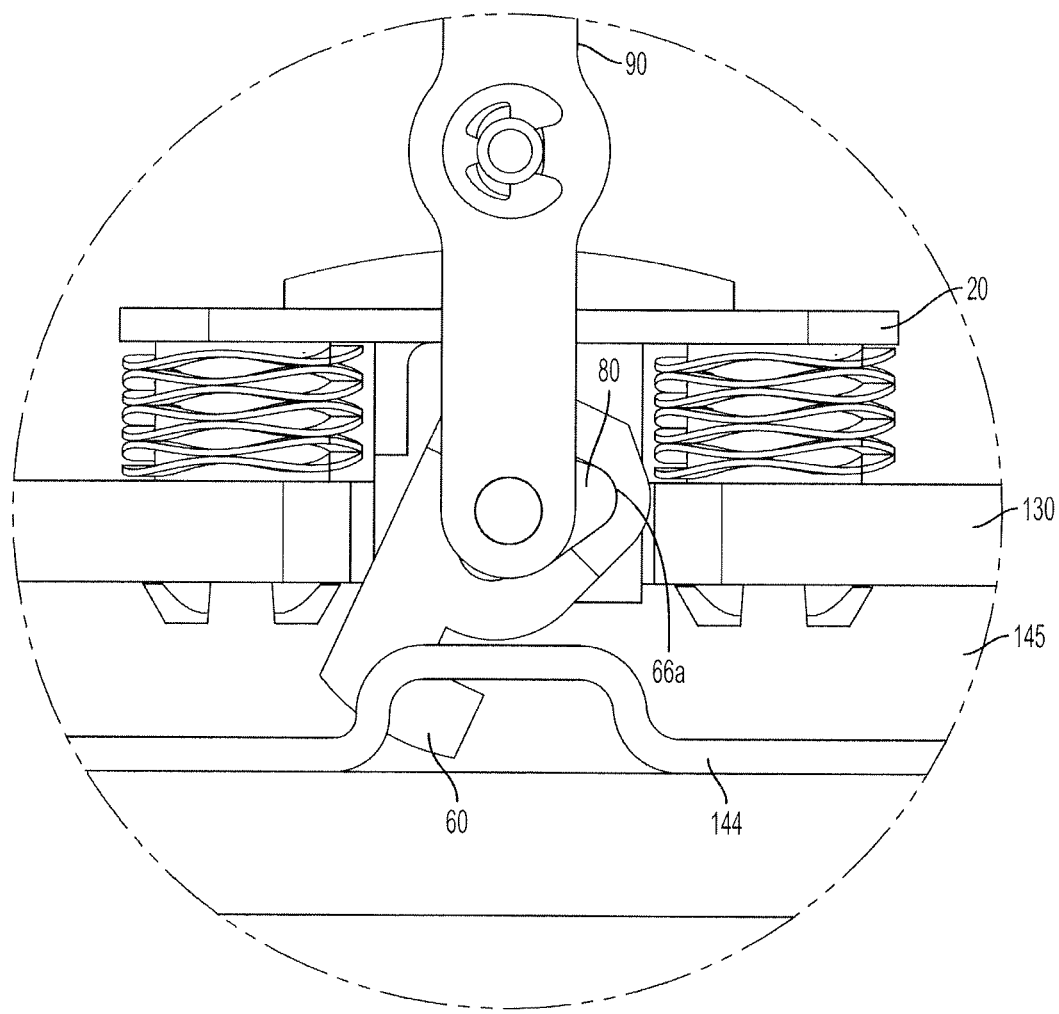
FIG. 8C is a detailed view of the initially engaged assembly of FIG. 8B.

Turning now to FIGS. 8A-8C, the heat sink assembly 133 is manually translated downward toward the PCB assembly 140 until the engagement portions 60 enter the respective slots 150 of the catches 144. At this stage the lower surface of the heat sink 130 contacts the top surface of the chip 145, however, this is not a requirement.

Figure 9A:
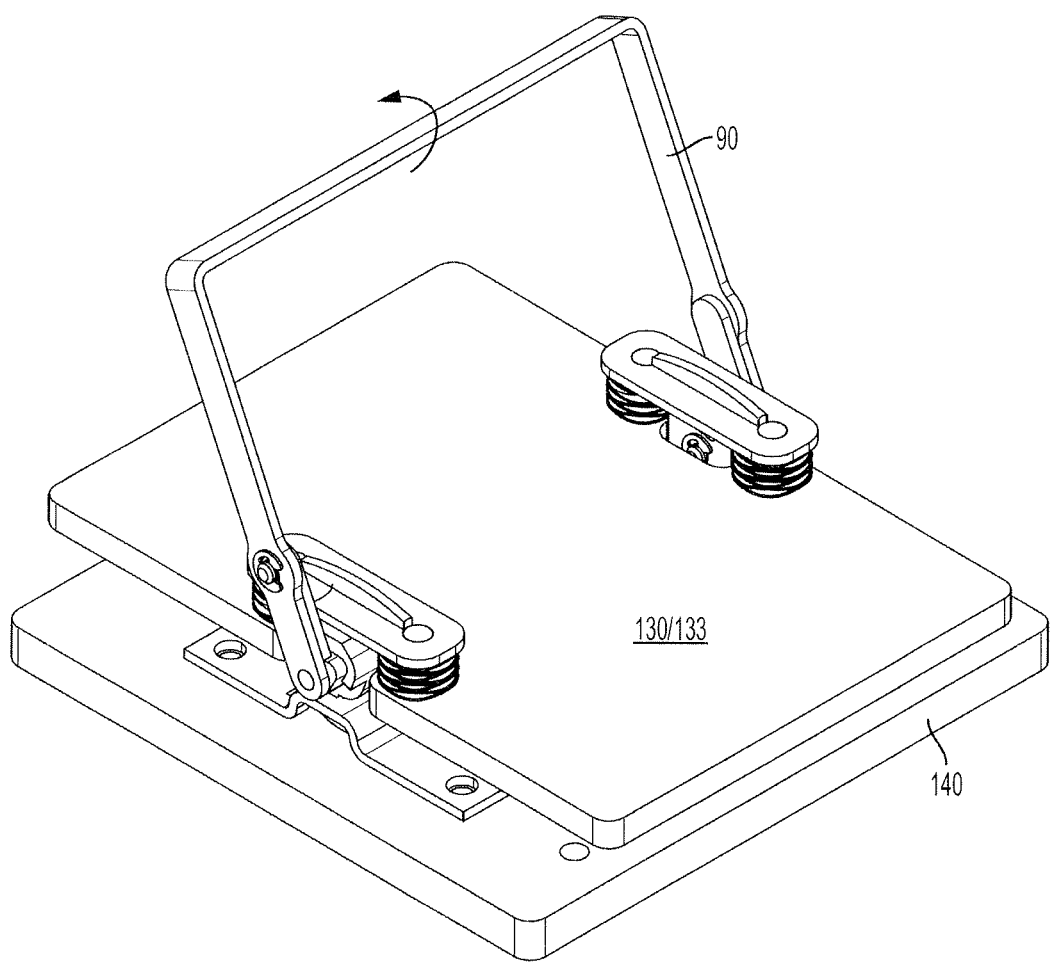
Figure 9B:
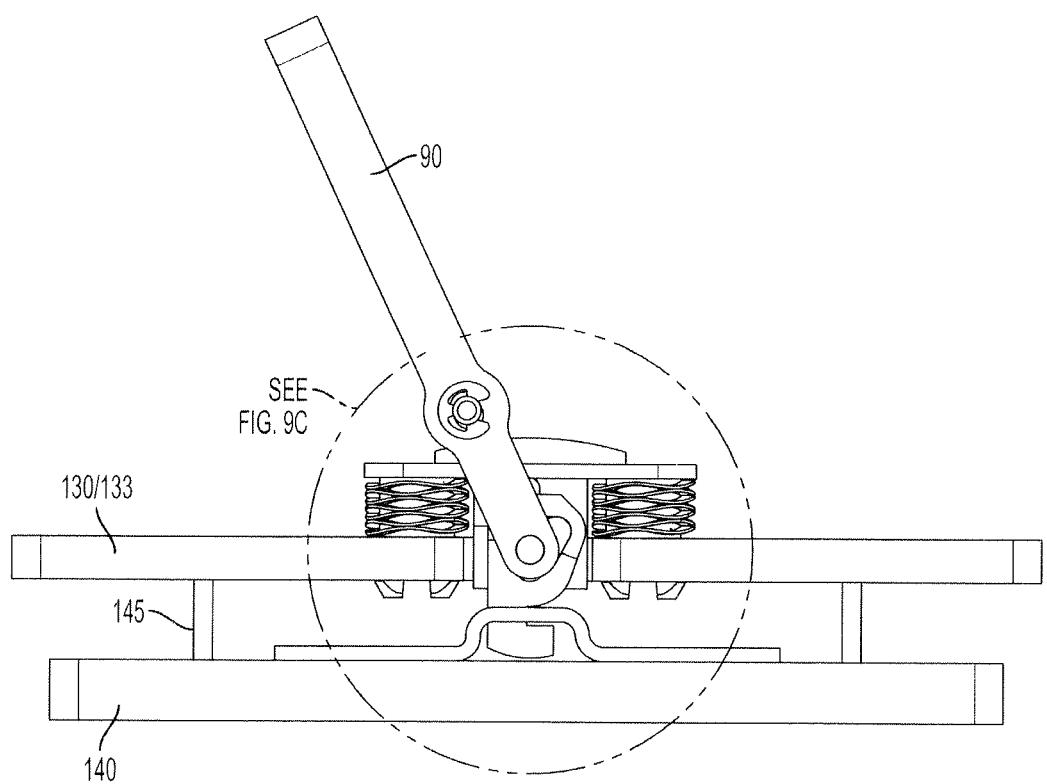
FIG. 9B is a side elevation view of the assembly of FIG. 9A.
Figure 9C:
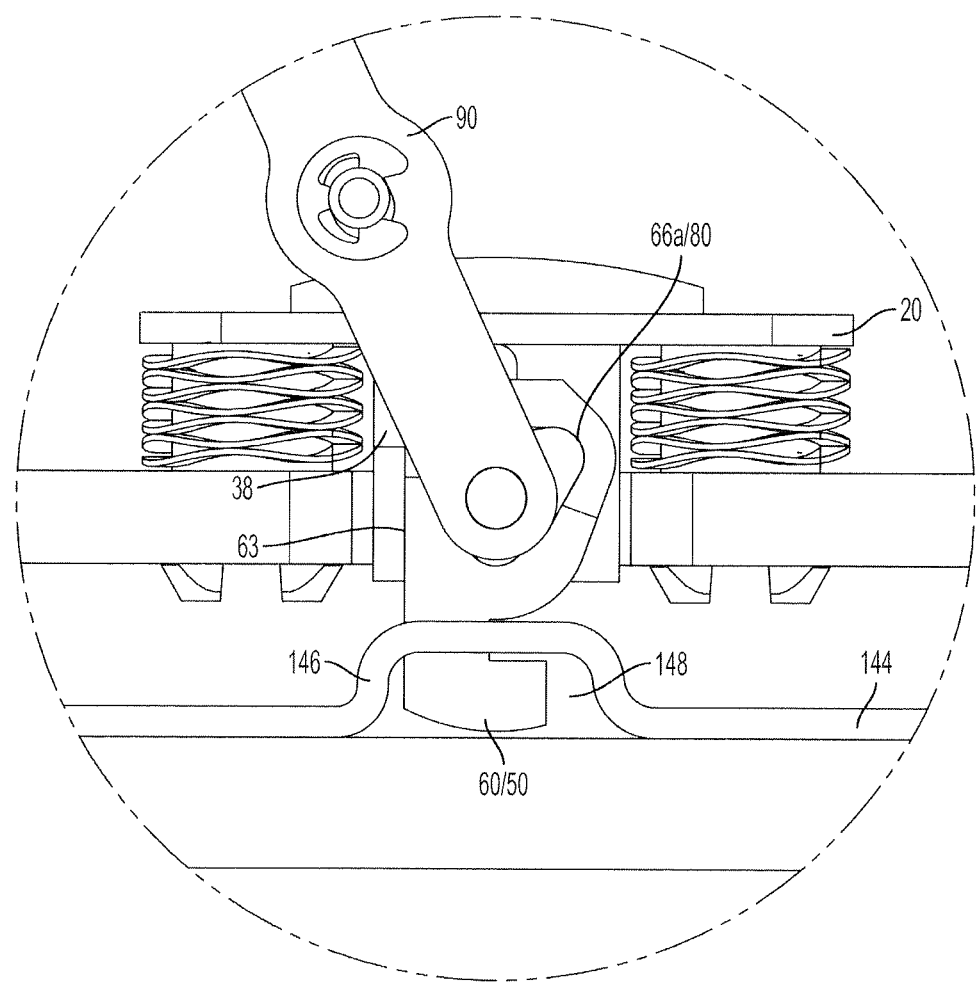
FIG. 9C is a detailed view of the assembly of FIG. 9B.

Turning now to FIGS. 9A-9C, the handle 90 is then rotated in the counter-clockwise direction. It will be understood that the components of the latch assembly, heat sink assembly, and computer product can be reversed or otherwise modified such that the handle 90 is configured to be rotated in the clockwise direction, as opposed to the counter-clockwise direction, for engagement.

In the embodiment illustrated in FIGS. 9A-9C, the lever 72 rotates along with the handle 90 in the counter-clockwise direction. The hook 50 also rotates along with the handle 90 in the counter-clockwise direction to a limited extent because the cam 80 of the lever 72 is seated in the recess 66a (see FIG. 2F) of the hook 50. As the hook 50 rotates about the post 86 of the lever 72, the post 70 of the hook 50 moves through the track 37a (see FIG. 1D) of the V-shaped slot 37 of the spring clamp 20. Thereafter, the post 70 is aligned with the bottom end of the track 37b of the V-shaped slot 37. At this stage, the engagement portion 60 of the hook 50 is seated in the gap 148 of the catch 144. The engagement portion 60 is prevented from rotating further in the counter-clockwise direction because the side face 63 of the hook 50 is seated against the wall 38 of the spring clamp 20.

Figure 10A:
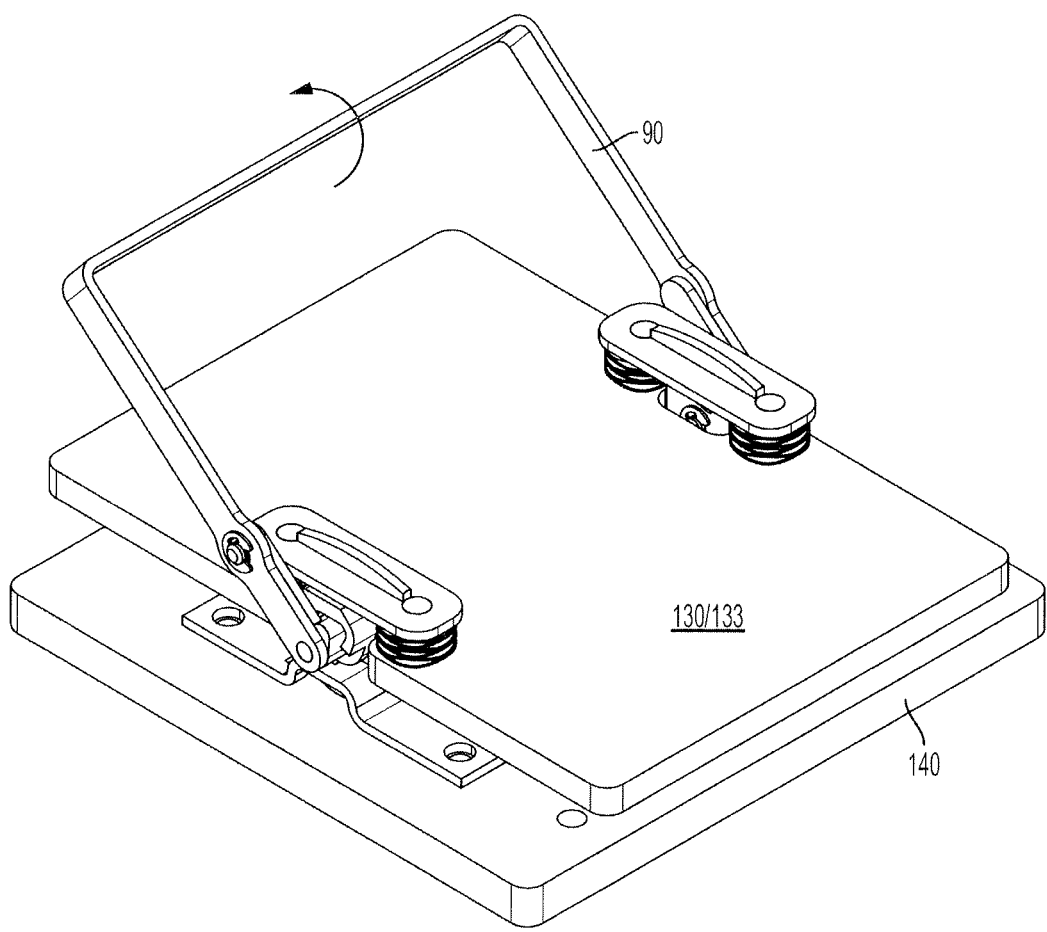
Figure 10B:
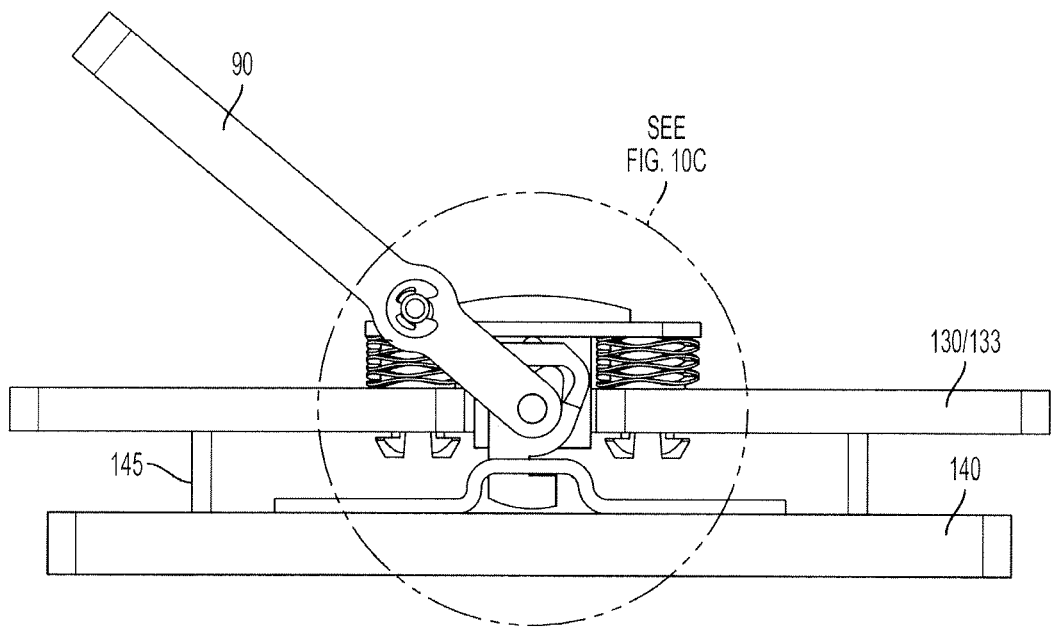
FIG. 10B is a side elevation view of the assembly of FIG. 10A.
Figure 10C:
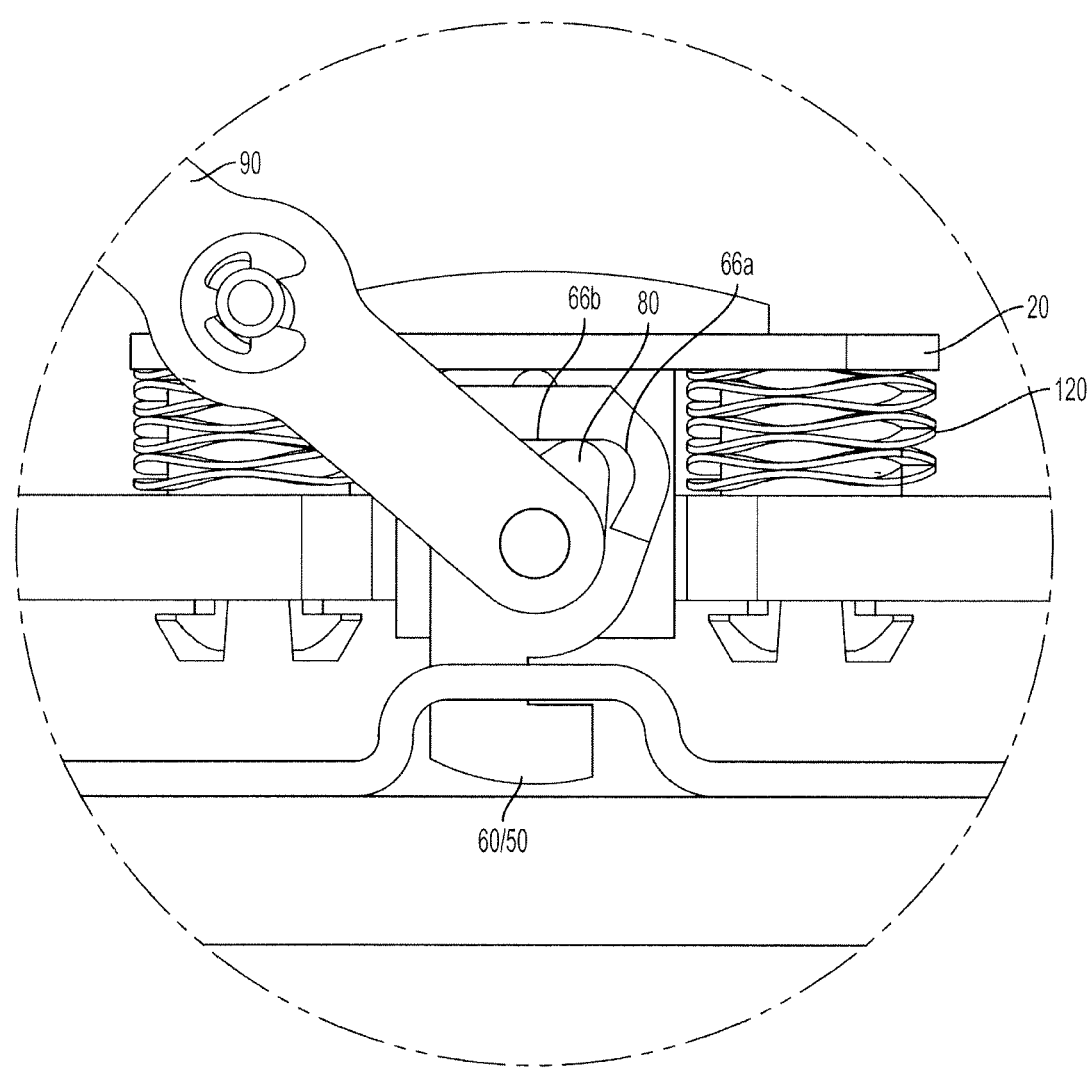
FIG. 10C is a detailed view of the assembly of FIG. 10B.

Turning now to FIGS. 10A-10C, the handle 90 is rotated further in the counter-clockwise direction. Rotating the handle 90 further causes the cam 80 to rotate with respect to the cam surface 66, and slide out of the curved section 66a and along the straight section 66b of the cam surface 66. The cam 80 is urged out of the curved section 66a because the engagement portion 60 is prevented from rotating further in the counter-clockwise direction because the side face 63 of the hook 50 is seated against the wall 38 of the spring clamp 20.

As the cam 80 slides along the straight section 66b of the cam surface 66, the hook 50 translates in the upward direction by a slight amount until the engagement portion 60 bears on the underside of the catch 144 by virtue of the geometry of the cam 80 and the cam surface 66. Once the engagement portion 60 bears on the underside of the catch 144, the lever 72 is then urged in a downward direction (i.e., toward the PCB assembly 140). The handle 90 and the spring clamp 20 move downwardly together along with the lever 72 due to the post 86 of the lever 72, which interconnects those components. Also, as the cam 80 slides along the straight section 66b and the spring clamp 20 translates downwardly, the post 86 of the lever 72 translates downwardly along the length of the slot 68 of the hook 50, and the track 37b of the V-shaped slot 37 of the spring clamp 20 translates downwardly along the post 70 of the hook 50.

The translating spring clamp 20 urges the heat sink 130 against the chip 145, or vice versa, against the bias of the springs 120 that are sandwiched between the spring clamp 20 and the heat sink 130. The springs 120 compress as the spring clamp 20 moves downward so as to avoid damaging the chip 145. The stiffness of the springs 120 influences the amount of pressure applied by the heat sink 130 onto the chip 145. The spring stiffness and number of springs may vary to suit any particular application.

Figure 11A:
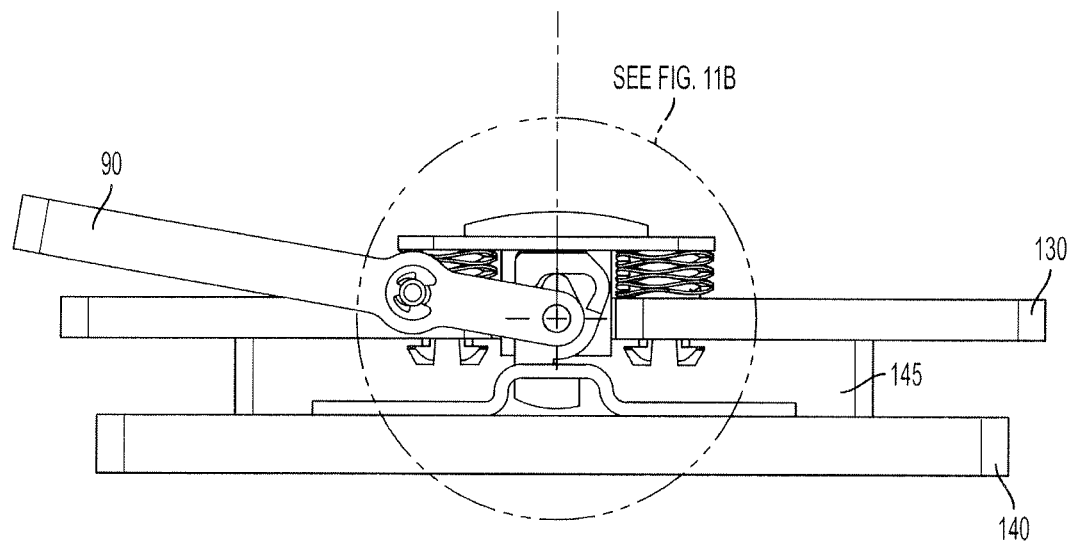
Figure 11B:
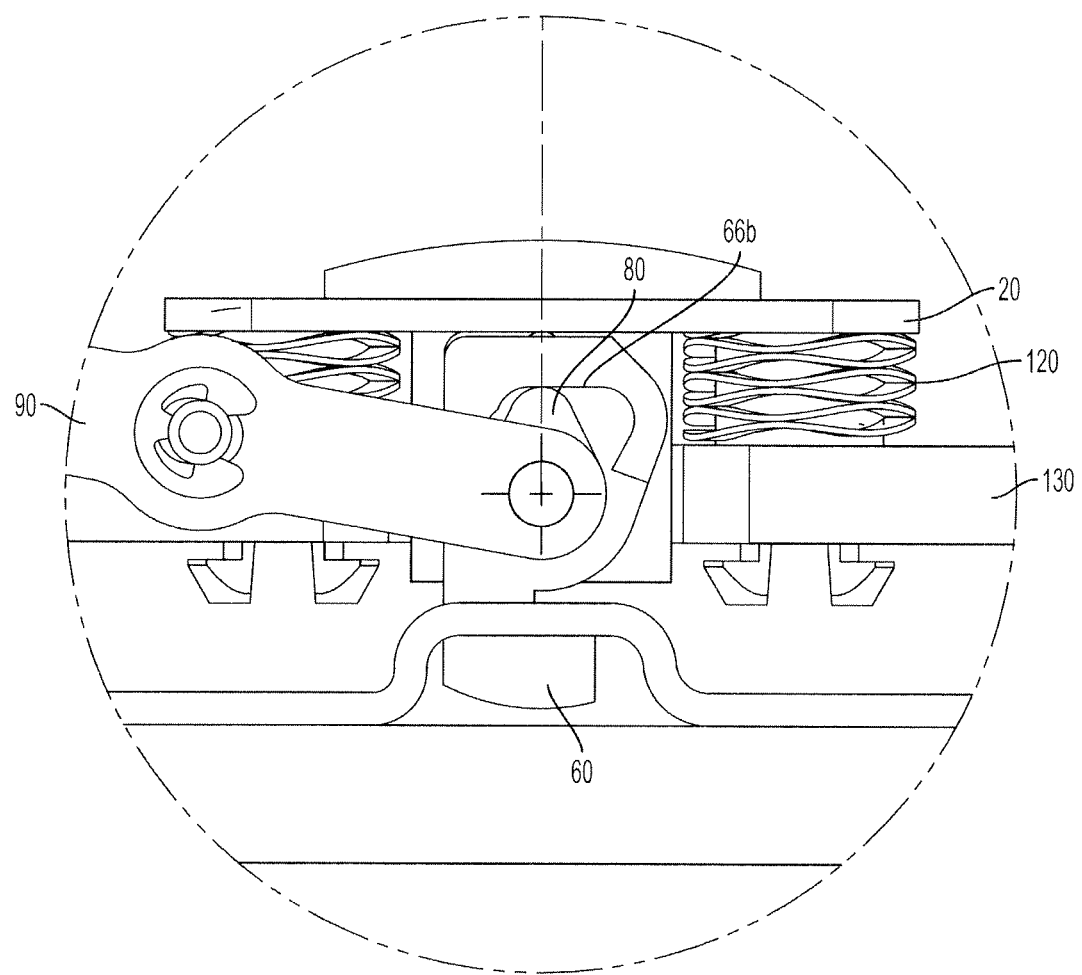
FIG. 11B is a detailed view of the assembly of FIG. 11A.

Turning now to FIGS. 11A and 11B, the handle 90 is rotated further in the counter-clockwise direction. Continuing to rotate the handle 90 from the position shown in FIG. 10A to the position shown in FIG. 11A causes the cam 80 to continue to rotate in the counterclockwise direction with respect to the cam surface 66, and slide along the straight section 66b of the cam surface 66. The free end of the cam 80 eventually reaches a top dead center position, as shown in FIG. 11B.

As the cam 80 slides along the straight section 66b of the cam surface 66, the lever 72 is continued to be urged in a downward direction (i.e., toward the PCB assembly 140). More particularly, the handle 90 and the spring clamp 20 move downwardly together along with the lever 72 due to the post 86 of the lever 72, which is interconnects those components. Also, as the cam 80 slides along the straight section 66b and the spring clamp 20 translates downwardly, the post 86 of the lever 72 continues to translate downwardly along the length of the slot 68 of the hook 50, and the track 37b of the V-shaped slot 37 of the spring clamp 20 continues to translate downwardly along the post 70 of the hook 50. The translating spring clamp 20 continues to urge the heat sink 130 against the chip 145, or vice versa. The spring clamp 20 translates against the bias of the springs 120 that are sandwiched between the spring clamp 20 and the heat sink 130. The springs 120 continue to compress as the spring clamp 20 moves downward so as to avoid damaging the chip 145.

Figure 12A:
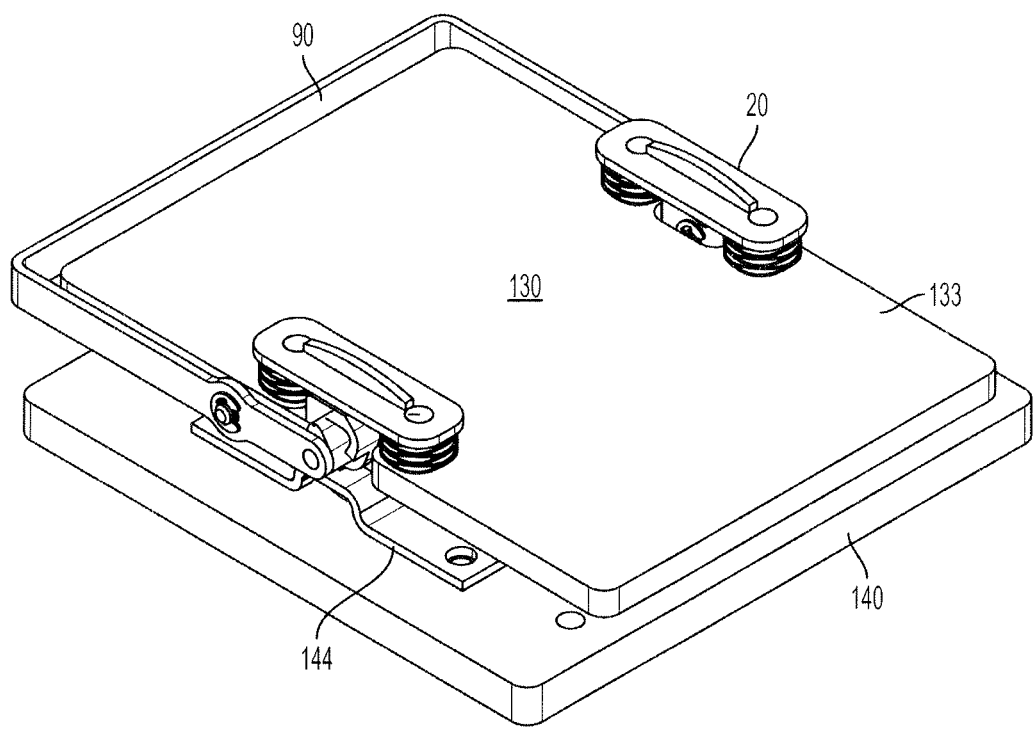
Figure 12B:
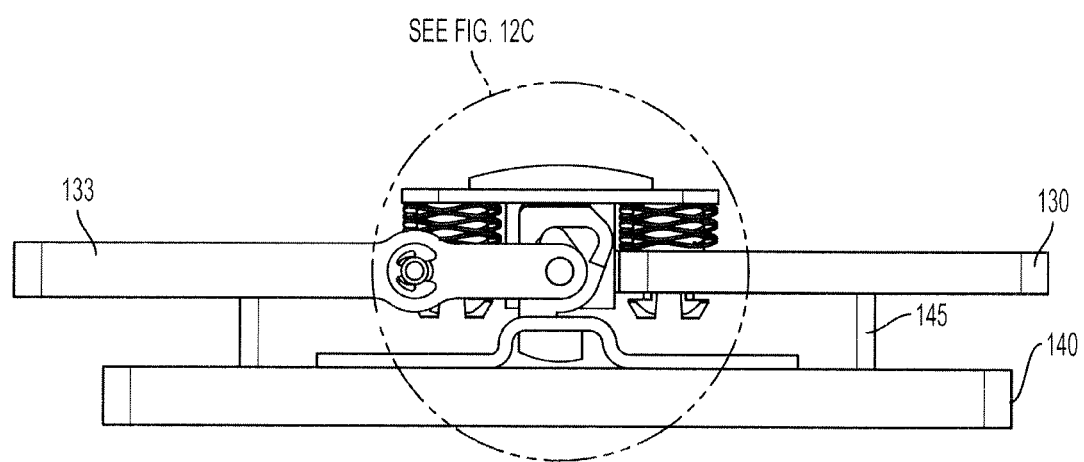
FIG. 12B is a side elevation view of the assembly of FIG. 12A.
Figure 12C:
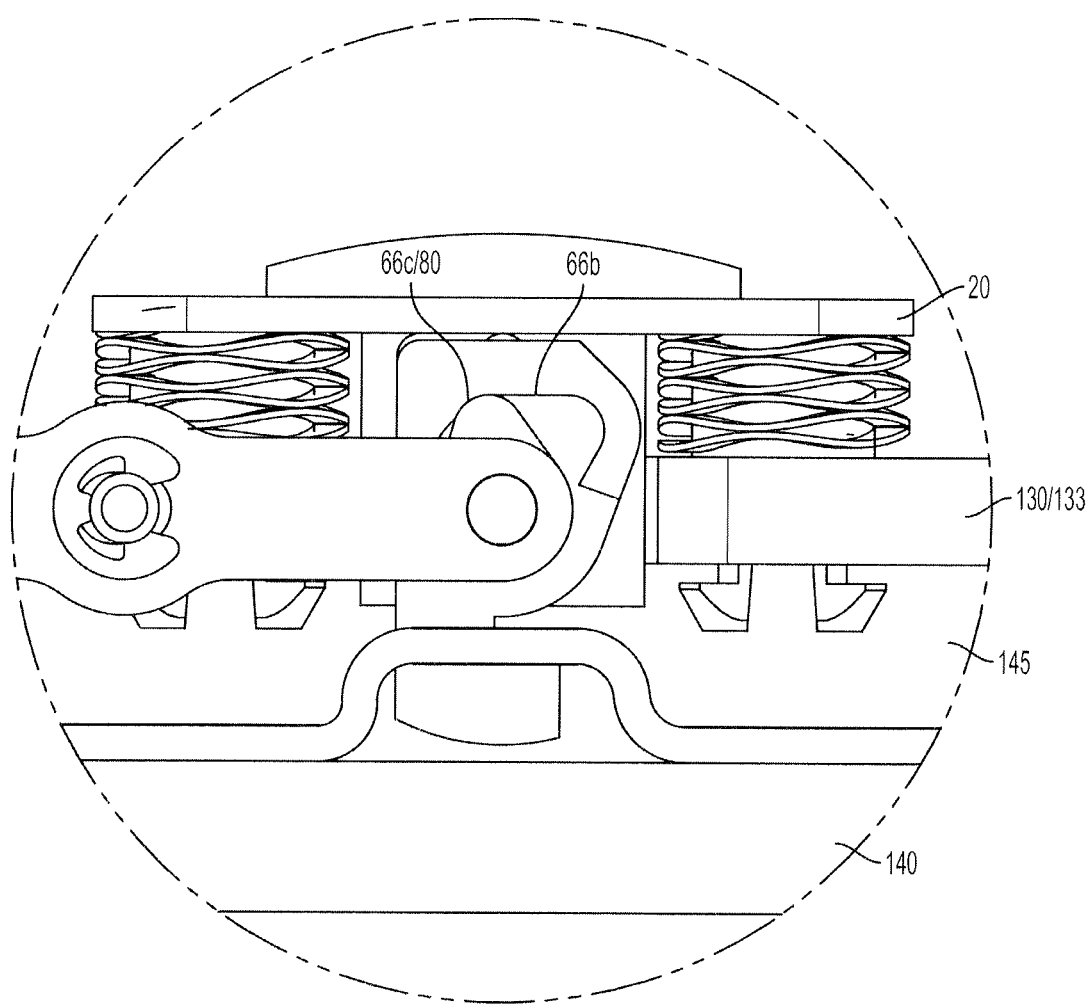
FIG. 12C is a detailed view of the assembly of FIG. 12B.

Turning now to FIGS. 12A-12C, the handle 90 is rotated further in the counter-clockwise direction until it reaches the "latched" (i.e., fastened) position or state. In the latched position, the handle 90 is oriented in a horizontal fashion to avoid interfering with the flow path of air (if any) over the fins 132 of the heat sink 130. Continuing to rotate the handle 90 from the position shown in FIG. 11A (top dead center) to the position shown in FIG. 12A causes the cam 80 to continue to rotate in the counterclockwise direction with respect to the cam surface 66, and slide along the straight section 66b of the cam surface 66 until the cam 80 is seated in the curved section 66c (see FIG. 12C). As the cam 80 slides, the lever 72 is urged in a slightly upward direction due to the load on the springs 120; and, the handle 90 and the spring clamp 20 move slightly upward together along with the lever 72. The post 86 of the lever 72 translates slightly upward along the length of the slot 68 of the hook 50. The track 37b of the V-shaped slot 37 of the spring clamp 20 translates slightly upward along the post 70 of the hook 50. The heat sink 130 may or may not move upwardly along with the lever 72 against the bias of the springs 120 depending upon (i) whether a gap exists between the heat sink 130 and the chip 145 after the step shown in FIGS. 10A-10C, and/or (ii) whether a compressible thermally conductive material positioned between the heat sink 130 and the chip 145 is capable of being compressed further.

In the latched state, the free end of the cam 80 is positioned in the curved section 66c of the cam surface 66, as noted above, and the lever 72 and handle 90 are prevented from rotating further counter clockwise. At the same time, the load from springs 120, transmitted through the spring clamp 20 and hook 50, is biasing the lever 72 and handle 90 to rotate in a counterclockwise direction by applying an upward force to the free end of cam 80 against cam surface 66c. The handle 90 (and the entire latch assembly 12) cannot move to the unlatched state unless a load sufficient to overcome the spring load bias is applied to the handle 90.

In the latched state of the heat sink assembly 133, sufficient surface pressure is maintained between the heat sink 130 and the chip 145 to maximize heat transfer there between. The mechanical advantage provided by the latch assembly 12 is sufficient to meet the heat transfer requirements of the chip manufacturer. The springs 120 permit slight movement of the heat sink assembly 133 as the chip 145 expands or contracts over its lifetime. As noted above, a thermally conductive material could be sandwiched between the heat sink 130 and the chip 145.

To return the latch assembly 12 to the unlatched state shown in FIG. 7A from the latched state shown in FIGS. 12A-12C, the user manually rotates the handle in a clockwise direction. Those skilled in the art will recognize that the components of the latch assembly 12 will all move in the opposite directions as described above when the latch assembly 12 is moved back from the latched state to the unlatched state.

The above-described process for latching a heat sink assembly 133 onto the PCB assembly 140 is rapid and convenient for the end-user because it comprises the simple steps of aligning the engagement portions 60 with the catches 144, and rotating the handle 90. Although not shown, alignment pins and corresponding alignment holes could be added to the PCB assembly 140 and the heat sink assembly 133 to further simplify the alignment process.

The assembly of the heat sink assembly 133 and the PCB assembly 140 constitute a computer product. A computer server can include one or more of the aforementioned computer products.

The latch assembly 12 may be provided as a kit along with two catches 144 for mounting to a PCB. The latch assembly 12 may also be provided with a selection of springs 120 having different stiffness coefficients, and a selection of levers 72 having different profiles for the cam 80. The end user would select the appropriate springs 120 and levers 72 from the kit that would achieve a desired compression force on the chip 145 for a particular application. Accordingly, the kit may be used universally with any PCB.

It has been discovered that, in order to perform properly, heat sinks preferably have a specified load applied to clamp them on top of a processor. According to aspects of this invention, it is possible for a single user input to compress the heat sink more evenly such as by compressing all springs uniformly. Also, this invention makes it possible to control the load by operation of latch mechanism, which can be advantageous in certain applications as compared to a user tightening screws or nuts. Moreover, it is noted that for applications requiring that the screws be tightened in a pre-defined sequence, damage to the chip could result if the pre-defined sequence is not followed. No such tightening sequencing is required for the latch assembly 12.

According to one aspect of the invention, the latch assembly can use a rotating cam to first pivot a hook and then pull the hook up to compress load applying springs. The hook engages a keeper fastened to a structure such as a PCB, and the cam can be moved over center to positively lock a heat sink in place. The latching mechanism can be retained in the heat sink with various mechanisms such as snap fit retainers, but is able to translate in the height direction of the heat sink so the processor can expand and contract and the heat sink moves together with it.

According to another aspect of the invention, the latch assembly or latching mechanism floats in the heat sink, assuring proper load application of springs. Accordingly, a single user input can be used to generate high clamping loads. Also, the mechanism can be configured as a single unit that snaps into a heat sink.

It has further been discovered that an increase in force may be required in some applications (up to approximately 900 Newtons (N)) for heat dissipation. The latch assembly of this invention is capable of applying such a force. Also, the latch assembly can apply such forces while being scalable and modifiable to have different handle width and lengths. Accordingly, the latch assembly can apply even pressure with less chance of damaging chips or other components of a computer product. Additionally, the low profile configuration of the latch assembly preferably does not block air flow across the heat sink.

The force range appropriate for the latch assembly 12 would be 444 to 1112 Newtons (N) with a 10% tolerance range.

Although the latch assembly of this invention can be operated other than by lever operation of the handle, such lever operation provides a mechanical advantage and improves user ergonomics. Also, because the load applied by the heat sink to the component to be cooled can be controlled by the latch assembly, the latch assembly can eliminate the variations introduced by an individual user (such as by tightening screws or nuts), such that the load can be more consistent.

As will be understood, a relatively precise load or load range can be applied to a component using the latch assembly of this invention. More specifically, geometries and properties of the latch components can be modified in order to customize the latch assembly for particular load requirements.

The latch assembly 12 is designed to provide a specific nominal load, and the load tolerance is determined by the manufacturing tolerances of the components including the height of the IC. The load exerted on the IC is dependent upon the distance that the wave springs are compressed. Nominal load can be varied by either maintaining the current compression distance and using a different wave spring or by revising lever cam geometry 80 and hook curved surface geometry 66 to vary the compression distance.

The handle 90 is a separate component from the lever 72 for economic and manufacturing reasons. More particularly, the lever 72 should be composed of a high strength material formed by Metal Injection Molding (MIM) (for example), whereas, the handle 90 is a stamped component (preferably, and for example). Stamping the handle is a very economical way to create the geometry required. The flexibility of separating lever and handle to customize for specific applications is a secondary benefit.

Although the embodiments of a latch assembly selected for illustration in this application are configured for latching a heat sink onto a printed circuit board to dissipate heat from an integrated circuit device mounted to the printed circuit board, it will be appreciated that the latch assembly of this invention may be used to latch a wide variety of components relative to one another. For example, the latch assembly of this invention can be configured to releasably engage two or more components and may be especially useful where the load or compression or pressure applied to one or more of the components is to be increased, decreased or otherwise controlled within a range.

According to preferred aspects of the invention, it is possible to provide an improved heat sink system having a specified load in which a single user input can compress every spring of the assembly, and the spring load is controlled by the mechanism, not by a particular user. Accordingly, the invention makes it possible to very simply and easily apply a controlled degree of compression to a heat sink or other component while reducing or even eliminating variations in the load that can result from a user's selection of tightening force or possible user error.

Also, according to preferred aspects of the invention, the latching mechanism "floats" in the heat sink, thereby assuring proper load applications of the springs. This feature may be particularly beneficial in situations where a spring can allow the heat sink to conform to the top of a chip or to grease or some other material applied to the top of a chip; in other words, the "floating" characteristic allows for more uniform contact with the top of the component being cooled.

Additionally, the mechanism can be configured as a single unit that simply snaps into a heat sink or is assembled by a "drop-in" procedure that can reduce manufacturing time as well as reduce manufacturing error.

It will be appreciated by one of skill in this art that various variations and modifications to the embodiments shown and selected for illustration and description can be made without departing from the spirit or the scope of this invention. For example the number of springs can be reduced or increased, depending on the application. While two pairs of springs may be suitable for some applications, it may be possible to provide a single spring or a single pair of springs for other applications. Additionally, the location of the latching mechanisms can be moved, such as by relocating them from the sides of the heat sink to opposing ends or corners. Likewise, there may be more than one handle used in linking a pair or more than one pair of latch locations.

Also the load applied to the heat sink can be adjusted in a variety of ways; for example, by changing the spring and/or by changing the cam shape that results in compression. Additionally, while two springs on each side of the heat sink maybe suitable in order to provide balance and increased compression force, it is contemplated that there can be a single spring on each side or other numbers of springs.

It is beneficial to locate the handle as in the embodiments selected for illustration, but the location of the handle can be varied. In the illustrated embodiments, for example, the handle location does not interfere with the flow of air through fins of the heat sink. And although it may be beneficial to provide a handle that bridges two spaced-apart latch locations, separate handles or levers can instead be provided. Likewise, it is preferable to provide the handle and clamps in line with the heat sink fins so that springs and other structures do not block airflow through the fins. For example, the latch mechanisms' positioning on the sides of the heat sink do not interfere with airflow through the fins; nevertheless, in some applications it may be beneficial to place the latch mechanism at the ends of the fins.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A latch assembly for latching a heat sink onto a printed circuit board to dissipate heat from an integrated circuit device mounted to the printed circuit board, the latch assembly comprising:
   a clamp having a connector configured for connecting the latch assembly to a surface of the heat sink;
   a spring coupled to the clamp and positioned for biasing the clamp away from the surface of the heat sink;
   a handle rotatably connected to the clamp;
   a cam surface extending from the handle;
   a hook moveably coupled to the clamp and having a cam surface engaged with the cam surface extending from the handle, the hook having an engagement portion configured for engaging the printed circuit board; and
   wherein rotation of the handle causes (i) rotation of the hook, which causes the engagement portion to engage the printed circuit board, followed by (ii) movement of the cam surface of the handle along the cam surface of the hook, which causes translation of the clamp toward the printed circuit board against the bias of the spring, which causes the heat sink to contact the integrated circuit device for dissipating heat from the integrated circuit device.

2. The latch assembly of claim 1, wherein the cam is provided on a lever that is attached to the handle.

3. The latch assembly of claim 1, wherein a post, which projects from the handle, is positioned through openings in the hook and the clamp, and wherein the hook rotates about the post.

4. The latch assembly of claim 3, wherein the opening of the hook is a slot and the post of the handle is capable of translating through the slot.

5. The latch assembly of claim 1, wherein the clamp includes a track for accommodating a post extending from the hook, and the track is configured to permit both rotation and translation of the hook with respect to the clamp.

6. The latch assembly of claim 1, wherein the engagement portion is a hook.

7. The latch assembly of claim 1, wherein movement of the cam surface of the handle along the cam surface of the hook beyond a top dead center position causes translation of the clamp away from the printed circuit board, due to the bias of the spring, until the latch assembly reaches a latched state, and, in the latched state, the bias of the spring limits the handle from inadvertently being rotated in an opposite direction and out of the latched state.

8. A heat sink assembly for dissipating heat from an integrated circuit device mounted to a printed circuit board, the heat sink assembly comprising:
   a heat sink;
   a clamp movably connected to the heat sink;
   a spring mounted to the clamp for biasing the clamp away from the heat sink;
   a handle rotatably connected to the clamp;
   cam extending from the handle;
   a hook moveably mounted to the clamp and having a cam surface engaged with the cam, the hook having an engagement portion for engaging the printed circuit board; and
   wherein rotation of the handle causes (i) rotation of the hook, which causes the engagement portion to engage the printed circuit board, followed by (ii) movement of the cam along the cam surface, which causes translation of the clamp toward the printed circuit board against the bias of the spring, which causes the heat sink to contact the integrated circuit device for dissipating heat from the integrated circuit device.

9. The heat sink assembly of claim 8, wherein the heat sink includes one or more holes for accommodating a connector of the clamp.

10. The heat sink assembly of claim 8, wherein a post projects from the handle and is positioned through openings in the hook and the clamp.

11. The heat sink assembly of claim 8, wherein movement of the cam along the cam surface beyond a top dead center position causes translation of the clamp away from the printed circuit board, due to the bias of the spring, until the handle reaches a latched state, and, in the latched state, the bias of the spring limits the handle from inadvertently being rotated in an opposite direction and out of the latched state.

12. A computer product comprising:
   a printed circuit board assembly including a printed circuit board and an integrated circuit device and a catch mounted to the printed circuit board;
   a heat sink for dissipating heat from the integrated circuit device;
   a clamp movably connected to the heat sink;
   a spring mounted to the clamp for biasing the clamp away from the heat sink;
   a handle rotatably connected to the clamp;
   a cam extending from the handle;
   a hook moveably mounted to the clamp and having a cam surface engaged with the cam, the hook having an engagement portion for engaging the catch of the printed circuit board; and
   wherein rotation of the handle causes (i) rotation of the hook, which causes the engagement portion to engage the printed circuit board, followed by (ii) movement of the cam along the cam surface, which causes translation of the clamp toward the printed circuit board against the bias of the spring, which causes the heat sink to contact the integrated circuit device for dissipating heat from the integrated circuit device.

13. The computer product of claim 12, wherein movement of the cam along the cam surface beyond a top dead center position causes translation of the clamp away from the printed circuit board, due to the bias of the spring, until the handle reaches a latched state, and, in the latched state, the bias of the spring limits the handle from inadvertently being rotated in an opposite direction and out of the latched state.

14. A server comprising a plurality of the computer products of claim 12.

15. The computer product of claim 12, wherein the printed circuit board includes one or more holes for accommodating a connector of the catch.

16. A method for cooling an integrated circuit device on a printed circuit board using a heat sink assembly, the method comprising the steps of:
   engaging a hook of the heat sink assembly with a catch on the printed circuit board; and
   rotating a handle attached to the heat sink assembly to cause the heat sink to be biased toward the printed circuit board and contact the integrated circuit device for transferring heat from the integrated circuit device to the heat sink, wherein rotation of the handle causes (i) the hook to bear on a catch of the printed circuit board, followed by (ii) movement of a cam of the handle along a cam surface of the hook, which causes translation of the cam toward the printed circuit board against the bias of a spring, which causes the heat sink to contract the integrated circuit device for dissipating heat from the integrated circuit device.

17. The method of claim 16, wherein movement of the cam along the cam surface beyond a top dead center position causes translation of the clamp away from the printed circuit board, due to the bias of the spring, until the handle reaches a latched state, and, in the latched state, the bias of the spring limits the handle from inadvertently being rotated in an opposite direction and out of the latched state.

18. A latch assembly for latching two or more component to one another within a predetermined force range, the latch assembly comprising:
   a clamp having a connector for connecting the latch assembly to one of the components;
   a spring mounted to the clamp for biasing the clamp away from the one of the components;
   a handle rotatably connected to the clamp;
   a cam extending from the handle;
   a hook moveably mounted to the clamp and having a cam surface engaged with the cam, the hook having an engagement portion for engaging another one of the components; and
   wherein rotation of the handle causes (i) rotation of the hook, which causes the engagement portion to engage the another one of the components, followed by (ii) movement of the cam along the cam surface, which causes translation of the one of the components toward the another one of the components against the bias of the spring, which causes the force between the one the other one of the components to be within the predetermined range.

19. The latch assembly of claim 18, wherein movement of the cam along the cam surface beyond a top dead center position causes translation of the one of the components away from the another one of the components, due to the bias of the spring, until the latch assembly reaches a latched state, and, in the latched state, the bias of the spring limits the handle from inadvertently being rotated in an opposite direction and out of the latched state.

* * * * *